(12) United States Patent
Langari et al.

(10) Patent No.: US 10,916,494 B2
(45) Date of Patent: Feb. 9, 2021

(54) DEVICE COMPRISING FIRST SOLDER INTERCONNECTS ALIGNED IN A FIRST DIRECTION AND SECOND SOLDER INTERCONNECTS ALIGNED IN A SECOND DIRECTION

(71) Applicant: QUALCOMM Incorporated, San Diego, CA (US)

(72) Inventors: Abdolreza Langari, San Diego, CA (US); Yuan Li, Irvine, CA (US); Shrestha Ganguly, Bangalore (IN); Terence Cheung, San Diego, CA (US); Ching-Liou Huang, San Diego, CA (US); Hui Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/453,803

(22) Filed: Jun. 26, 2019

(65) Prior Publication Data
US 2020/0211943 A1 Jul. 2, 2020

Related U.S. Application Data

(60) Provisional application No. 62/787,580, filed on Jan. 2, 2019.

(51) Int. Cl.
*H01L 23/498* (2006.01)
*H01L 23/538* (2006.01)
(Continued)

(52) U.S. Cl.
CPC .... *H01L 23/49816* (2013.01); *H01L 21/4853* (2013.01); *H01L 23/49827* (2013.01);
(Continued)

(58) Field of Classification Search
CPC ........... H01L 23/49816; H01L 23/5386; H01L 25/18; H01L 24/81; H01L 23/49838; H01L 23/5384; H01L 24/16
See application file for complete search history.

(56) References Cited

U.S. PATENT DOCUMENTS

| 5,633,479 A | 5/1997 | Hirano |
| 5,895,230 A | 4/1999 | Bartley |

(Continued)

FOREIGN PATENT DOCUMENTS

WO 2017203607 A1 11/2017

OTHER PUBLICATIONS

International Search Report and Written Opinion—PCT/US2019/064011—ISA/EPO—dated Mar. 26, 2020.

*Primary Examiner* — Dung A. Le
(74) *Attorney, Agent, or Firm* — Qualcomm Incorporated

(57) ABSTRACT

A device that includes a first die and a package substrate. The package substrate includes a dielectric layer, a plurality of vias formed in the dielectric layer, a first plurality of interconnects formed on a first metal layer of the package substrate, and a second plurality of interconnects formed on a second metal layer of the package substrate. The device includes a first series of first solder interconnects arranged in a first direction, the first series of first solder interconnects configured to provide a first electrical connection; a second series of first solder interconnects arranged in the first direction, the second series of first solder interconnects configured to provide a second electrical connection; a first series of second solder interconnects arranged in a second direction, the first series of second solder interconnects configured to provide the first electrical connection.

12 Claims, 19 Drawing Sheets

(51) Int. Cl.
*H01L 25/18* (2006.01)
*H01L 23/00* (2006.01)
*H01L 21/48* (2006.01)
*H01L 25/00* (2006.01)

(52) U.S. Cl.
CPC .... *H01L 23/49838* (2013.01); *H01L 23/5384* (2013.01); *H01L 23/5386* (2013.01); *H01L 24/16* (2013.01); *H01L 24/81* (2013.01); *H01L 25/18* (2013.01); *H01L 25/50* (2013.01); *H01L 2224/16235* (2013.01); *H01L 2224/81801* (2013.01); *H01L 2924/1421* (2013.01); *H01L 2924/1432* (2013.01); *H01L 2924/1434* (2013.01)

(56) References Cited

U.S. PATENT DOCUMENTS

| | | | |
|---|---|---|---|
| 7,847,404 B1 | 12/2010 | Schwegler et al. | |
| 2005/0186769 A1 | 8/2005 | Young | |
| 2012/0074585 A1* | 3/2012 | Koo | H01L 23/49827 257/774 |
| 2014/0102777 A1* | 4/2014 | Chen | H05K 1/115 174/266 |
| 2019/0131202 A1 | 5/2019 | Oyamada | |
| 2020/0176368 A1* | 6/2020 | Hoffmeyer | H01L 23/5384 |

\* cited by examiner

PROFILE VIEW

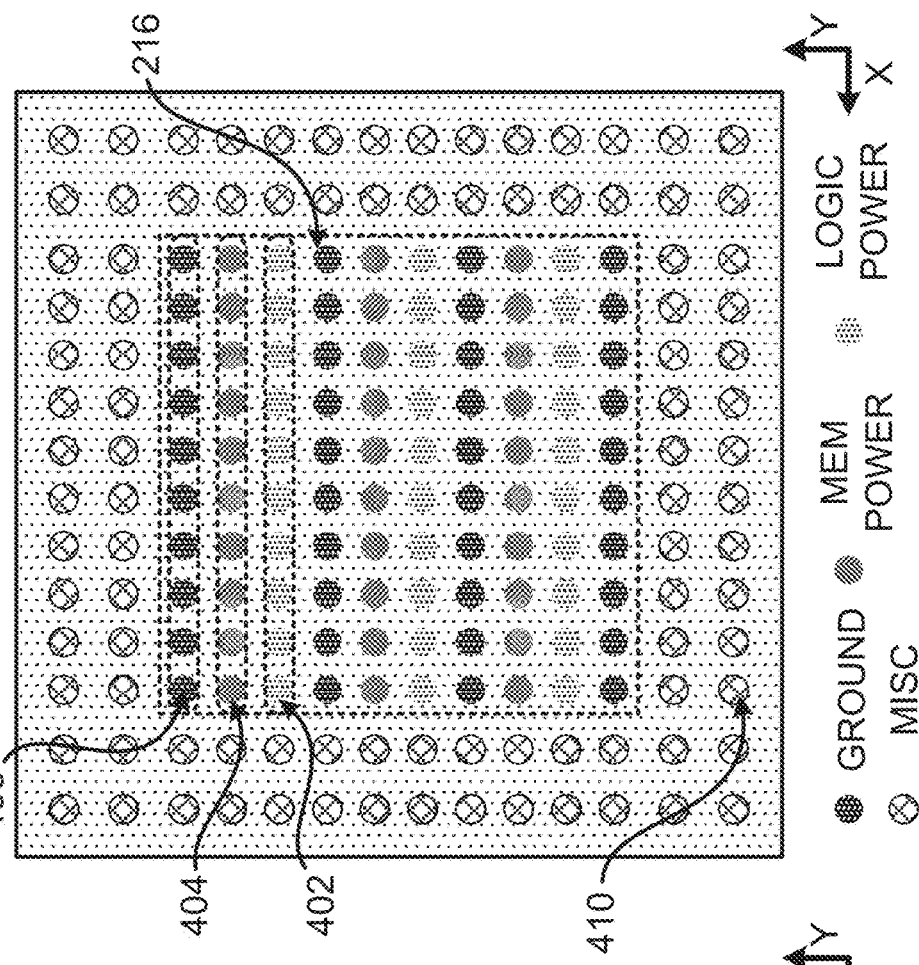
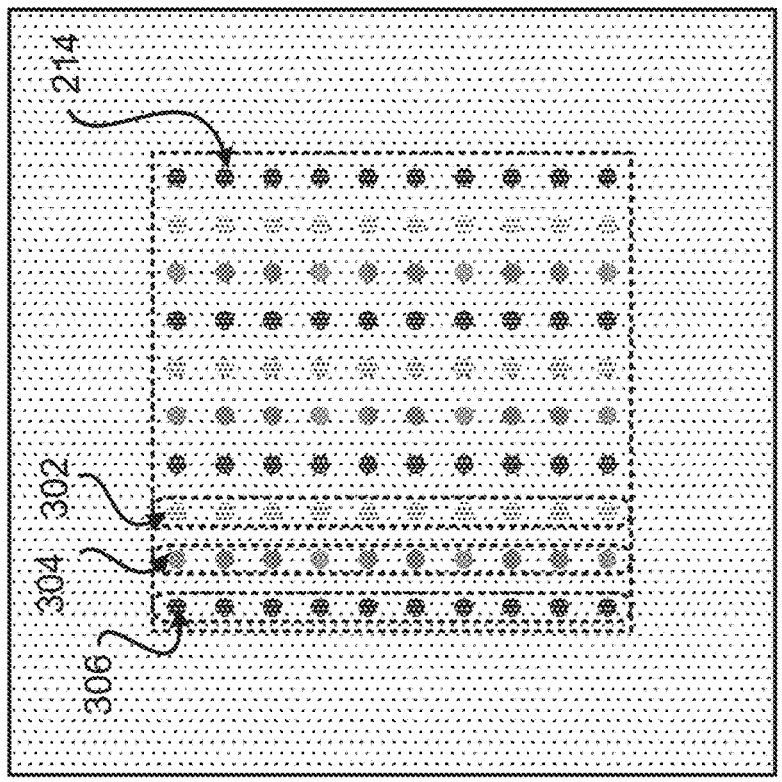
PLAN VIEW
FIG. 3
PLAN VIEW
FIG. 4

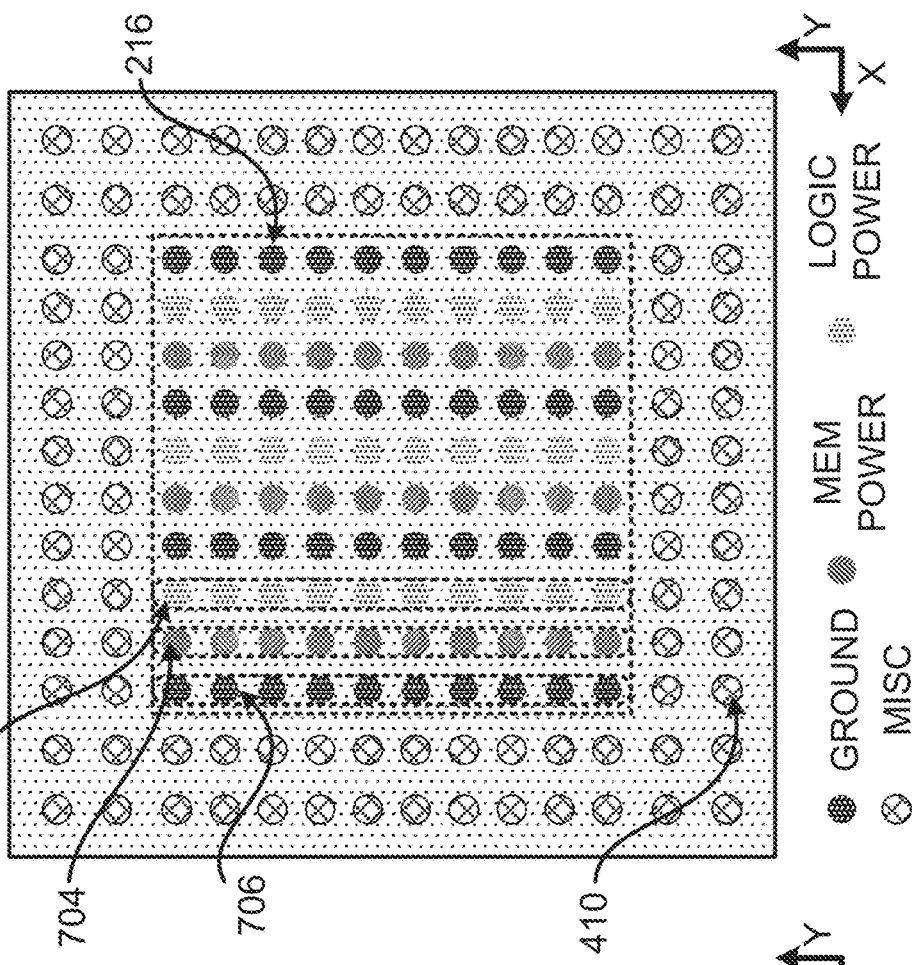
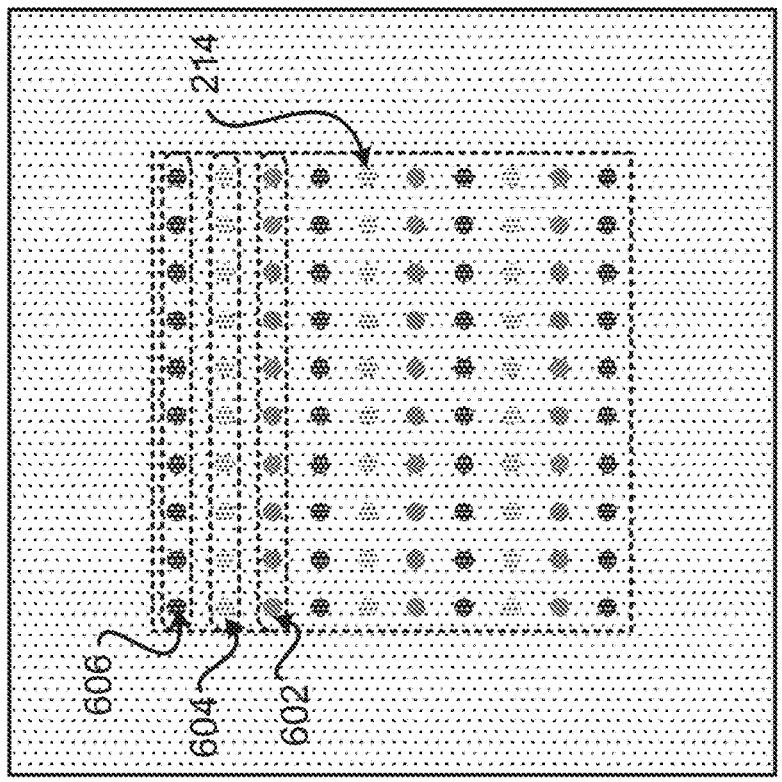

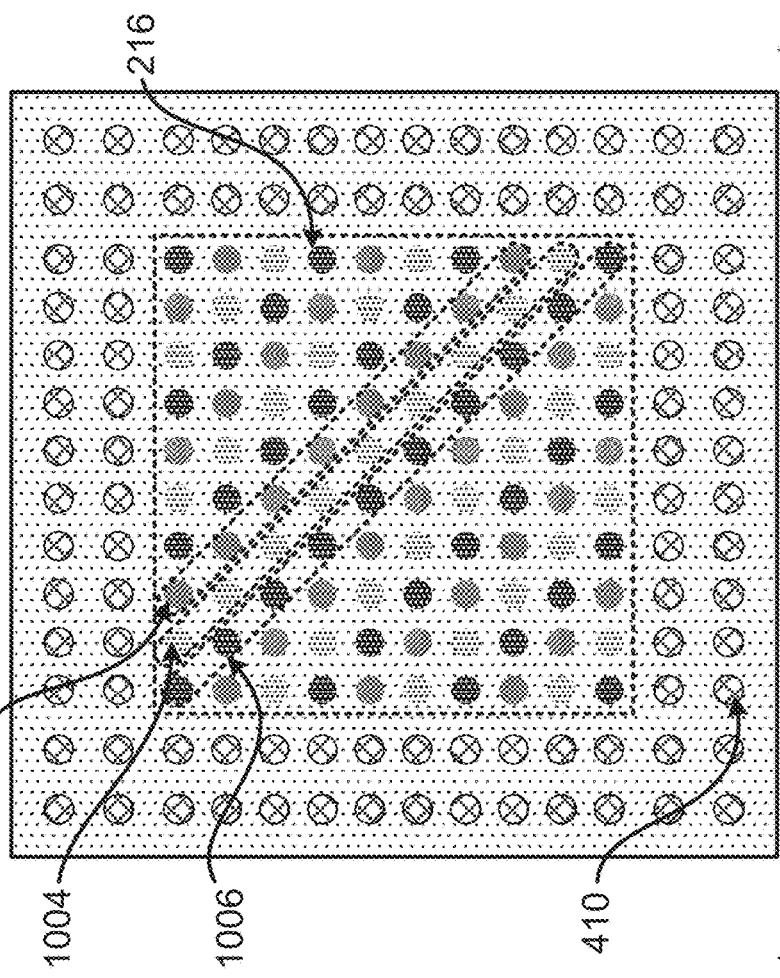
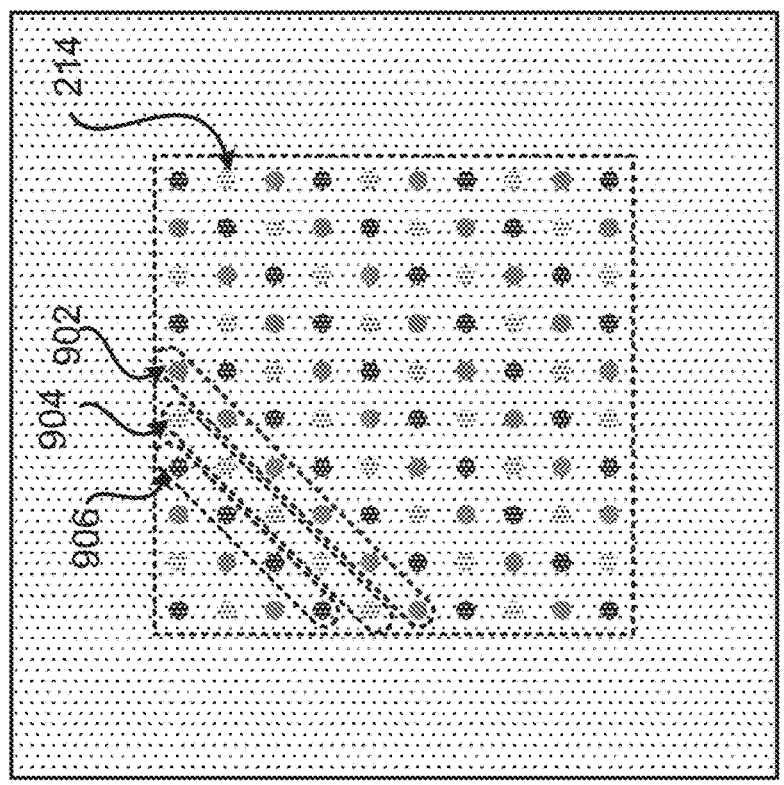

PROFILE VIEW

PROFILE VIEW

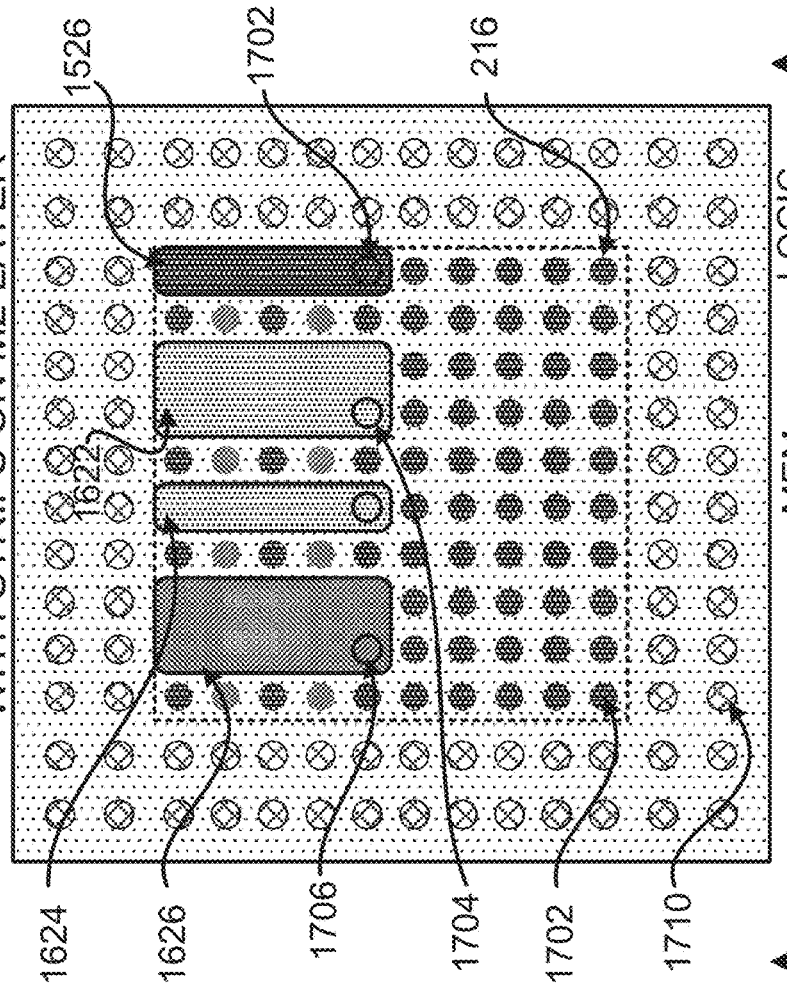
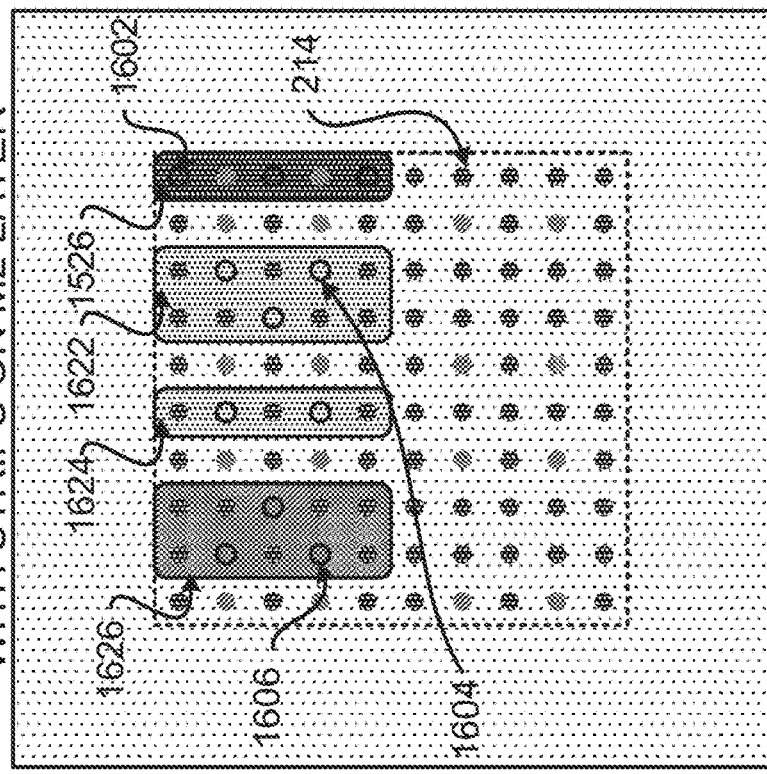

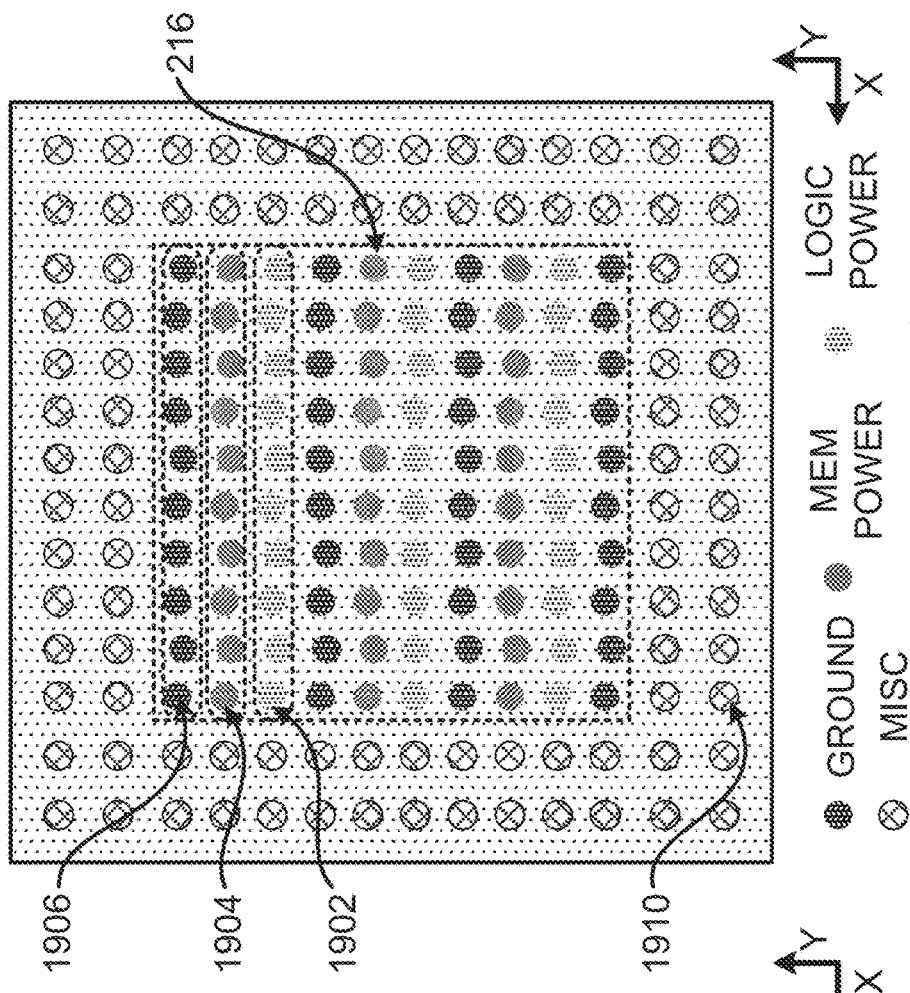
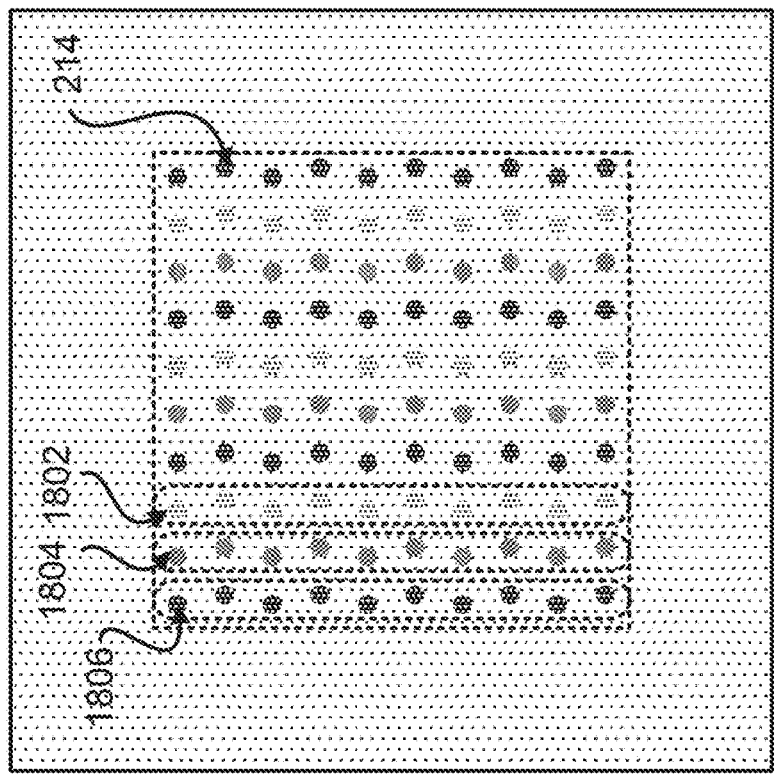
PLAN VIEW
FIG. 18
PLAN VIEW
FIG. 19

PROFILE VIEW

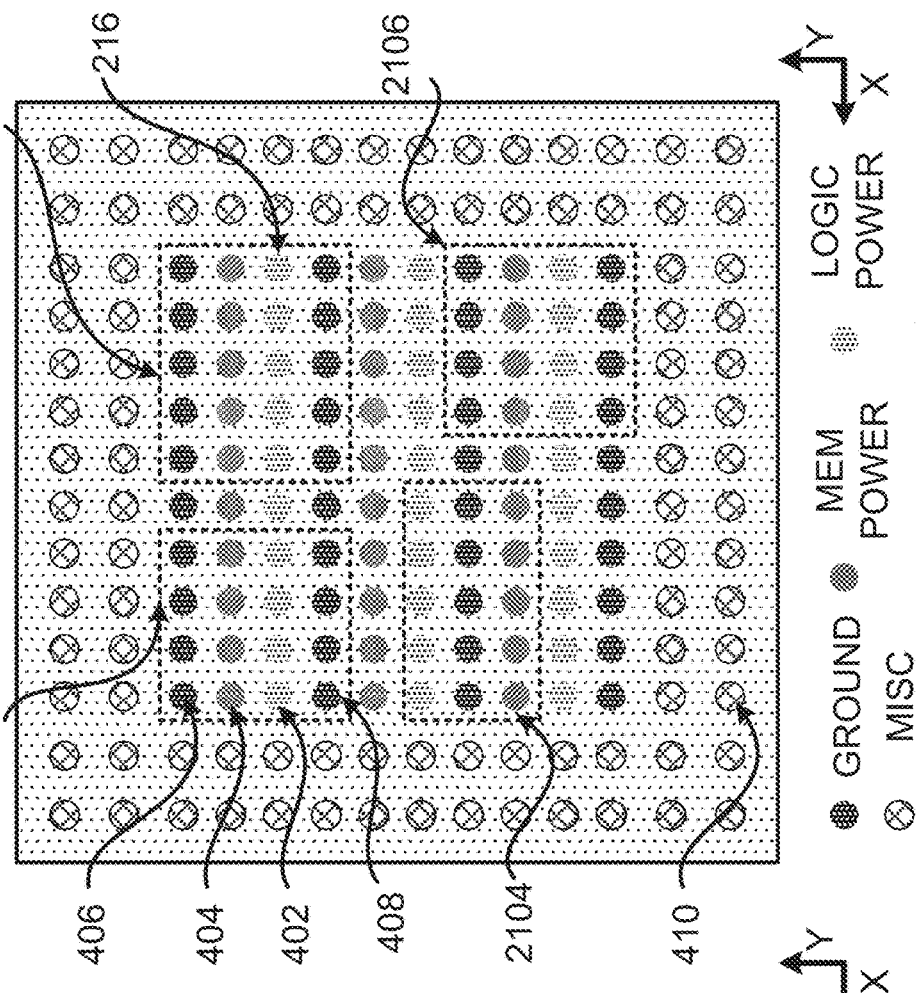
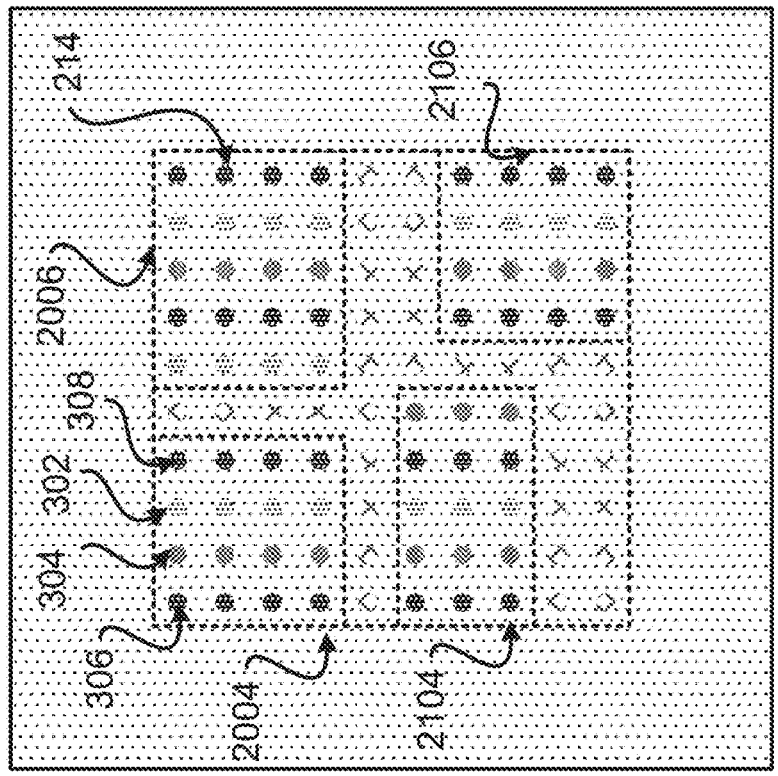
PLAN VIEW
FIG. 22
PLAN VIEW
FIG. 21

PLAN VIEW

DEVICE COMPRISING FIRST SOLDER INTERCONNECTS ALIGNED IN A FIRST DIRECTION AND SECOND SOLDER INTERCONNECTS ALIGNED IN A SECOND DIRECTION

CROSS-REFERENCE TO RELATED APPLICATION(S)

This application claims priority to and the benefit of Provisional Application No. 62/787,580, filed in the U.S. Patent and Trademark Office on Jan. 2, 2019, the entire contents of which is incorporated herein by reference as if fully set forth below in their entirety and for all applicable purpose.

FIELD

Various features relate to devices that includes a die and a package substrate, but more specifically to devices that include a die, a package substrate, a plurality of first solder interconnects aligned in a first direction, and a plurality of second solder interconnects aligned in a second direction.

BACKGROUND

FIG. 1 illustrates an integrated device 100 that includes a substrate 102 and a die 104. The die 104 is coupled to a first surface of the substrate 102 through a plurality of solder interconnects 140, which may include bumps and pillars.

The substrate 102 includes a plurality of dielectric layers 120, a plurality of interconnects 122, and a plurality of surface interconnects 123. Each layer of the dielectric layers 120 includes a patterned metal layer and vias. The substrate 102 includes a first solder resist layer 124, a second solder resist layer 126, and a plurality of solder interconnects 130.

The plurality of solder interconnects 130 and the plurality of solder interconnects 140 may be arranged in a particular way to accommodate the designs of the die 104 and the plurality of interconnects 122 of the substrate 102. These designs may not be optimal and can be expensive to create. Thus, different dies may require a different arrangement of solder interconnects 130 and 140.

Therefore, there is a need for providing a device that includes solder interconnects that are designed, arranged, aligned, and/or configured in a particular manner such that the solder interconnects may be used with different dies.

SUMMARY

Various features relate to devices that includes a die and a package substrate, but more specifically to devices that include a die, a package substrate, a plurality of first solder interconnects aligned in a first direction, and a plurality of second solder interconnects aligned in a second direction.

One example provides a device that includes a first die and a package substrate. The package substrate includes a dielectric layer, a plurality of vias formed in the dielectric layer, a first plurality of interconnects formed on a first metal layer of the package substrate, and a second plurality of interconnects formed on a second metal layer of the package substrate. The device includes a plurality of first solder interconnects coupled to the first plurality interconnects; and a plurality of second solder interconnects coupled to the second plurality interconnects. The plurality of first solder interconnects includes a first series of first solder interconnects arranged in a first direction, the first series of first solder interconnects configured to provide a first electrical connection; and a second series of first solder interconnects arranged in the first direction, the second series of first solder interconnects configured to provide a second electrical connection. The plurality of second solder interconnects includes a first series of second solder interconnects arranged in a second direction, the first series of second solder interconnects configured to provide the first electrical connection; and a second series of second solder interconnects arranged in the second direction, the second series of second solder interconnects configured to provide the second electrical connection.

Another example provides a device that includes a first die and a package substrate. The package substrate includes a dielectric layer, a plurality of vias formed in the dielectric layer, a first plurality of interconnects formed on a first metal layer of the package substrate, and a second plurality of interconnects formed on a second metal layer of the package substrate. The second plurality of interconnects includes a first strip. The device includes a plurality of first solder interconnects coupled to the first plurality interconnects; and a plurality of second solder interconnects coupled to the second plurality interconnects. The plurality of first solder interconnects includes a first series of first solder interconnects arranged in a first direction, the first series of first solder interconnects configured to provide a first electrical connection, wherein at least one solder interconnect from the first series of first solder interconnects vertically overlaps with the first strip; and a second series of first solder interconnects arranged in the first direction, the second series of first solder interconnects configured to provide a second electrical connection. The plurality of second solder interconnects includes a first series of second solder interconnects arranged in a second direction, the first series of second solder interconnects configured to provide the first electrical connection, wherein at least one solder interconnect from the first series of second solder interconnects vertically overlaps with the first strip; and a second series of second solder interconnects arranged in the second direction, the second series of second solder interconnects configured to provide the second electrical connection.

Another example provides a method for fabricating a device. The method provides a package substrate, wherein providing the package substrate includes: providing a dielectric layer; forming a plurality of vias in the dielectric layer; forming a first plurality of interconnects on a first metal layer of the package substrate; and forming a second plurality of interconnects on a second metal layer of the package substrate, wherein the second plurality of interconnects includes a first strip. The method couples a plurality of first solder interconnects to the first plurality interconnects, wherein the plurality of first solder interconnects includes: a first series of first solder interconnects arranged in a first direction, the first series of first solder interconnects configured to provide a first electrical connection, wherein at least one solder interconnect from the first series of first solder interconnects vertically overlaps with the first strip; and a second series of first solder interconnects arranged in the first direction, the second series of first solder interconnects configured to provide a second electrical connection. The method couples a first die to the package substrate through the plurality of solder interconnects. The method couples a plurality of second solder interconnects to the second plurality interconnects, wherein the plurality of second solder interconnects includes: a first series of second solder interconnects arranged in a second direction, the first series of second solder interconnects configured to provide the first electrical connection, wherein at least one solder interconnect from the first series of second solder interconnects vertically overlaps with the first strip; and a second series of second solder interconnects arranged in the second direction, the second series of second solder interconnects configured to provide the second electrical connection.

BRIEF DESCRIPTION OF THE DRAWINGS

Various features, nature and advantages may become apparent from the detailed description set forth below when taken in conjunction with the drawings in which like reference characters identify correspondingly throughout.

FIG. 3 illustrates a plan view of a device across an arrangement of top solder interconnects.

FIG. 4 illustrates a plan view of a device across an arrangement of bottom solder interconnects.

FIG. 6 illustrates a plan view of a device across an arrangement of top solder interconnects.

FIG. 7 illustrates a plan view of a device across an arrangement of bottom solder interconnects.

FIG. 9 illustrates a plan view of a device across an arrangement of top solder interconnects.

FIG. 10 illustrates a plan view of a device across an arrangement of bottom solder interconnects.

FIG. 16 illustrates a plan view of a device across an arrangement of top solder interconnects and strips on a metal layer of the substrate.

FIG. 17 illustrates a plan view of a device across an arrangement of bottom solder interconnects and strips on a metal layer of the substrate.

FIG. 18 illustrates a plan view of a device across an arrangement of top offset solder interconnects.

FIG. 19 illustrates a plan view of a device across an arrangement of bottom offset solder interconnects.

FIG. 21 illustrates a plan view of a device across an arrangement of top solder interconnects.

FIG. 22 illustrates a plan view of a device across an arrangement of bottom solder interconnects.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a first die and a package substrate. The package substrate includes a dielectric layer, a plurality of vias formed in the dielectric layer, a first plurality of interconnects formed on a first metal layer of the package substrate, and a second plurality of interconnects formed on a second metal layer of the package substrate. The device includes a plurality of first solder interconnects coupled to the first plurality interconnects formed on the first metal layer; and a plurality of second solder interconnects coupled to the second plurality interconnects formed on the second metal layer. The plurality of first solder interconnects includes a first series of first solder interconnects arranged in a first direction, the first series of first solder interconnects configured to provide a first electrical connection; and a second series of first solder interconnects arranged in the first direction, the second series of first solder interconnects configured to provide a second electrical connection. The plurality of second solder interconnects includes a first series of second solder interconnects arranged in a second direction, the first series of second solder interconnects configured to provide the first electrical connection; and a second series of second solder interconnects arranged in the second direction, the second series of second solder interconnects configured to provide the second electrical connection. In some implementations, the second plurality of interconnects may include one or more strips (e.g., first strip, second strip).

Exemplary Device Comprising an Arrangement of Solder Interconnects

Figure 1:
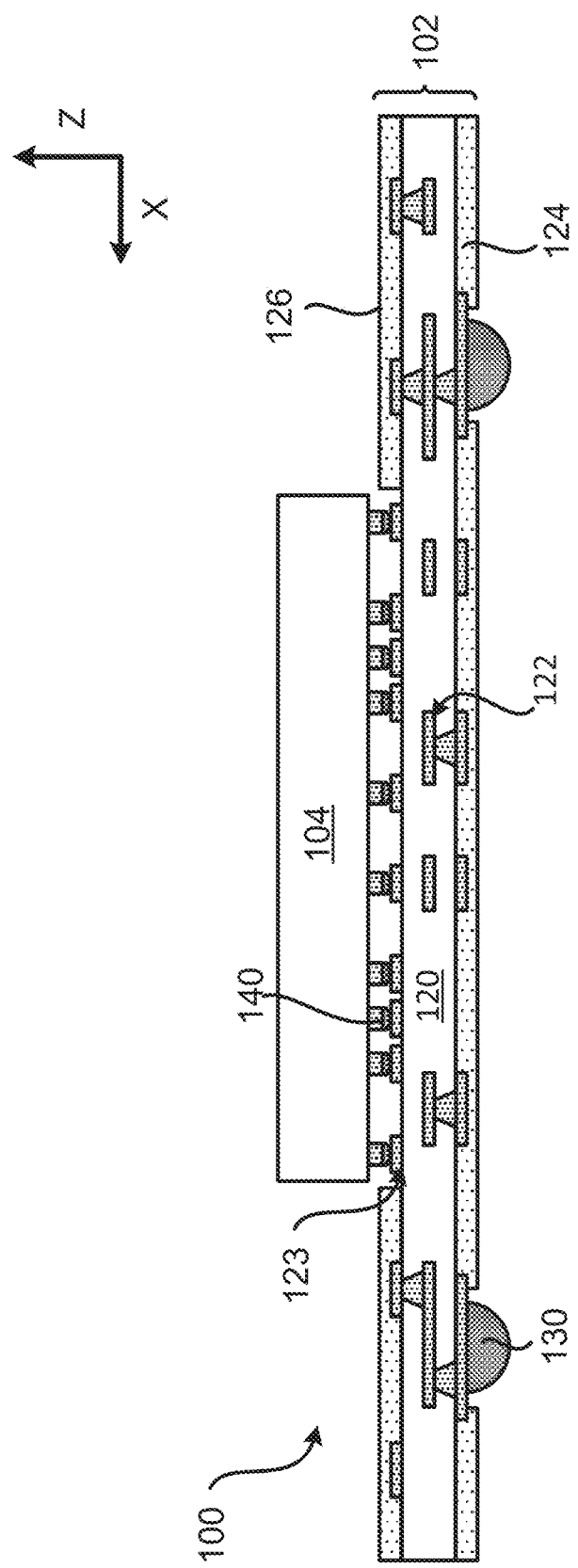
FIG. 1 illustrates a profile view of an integrated device that includes a die, a substrate.
Figure 2:
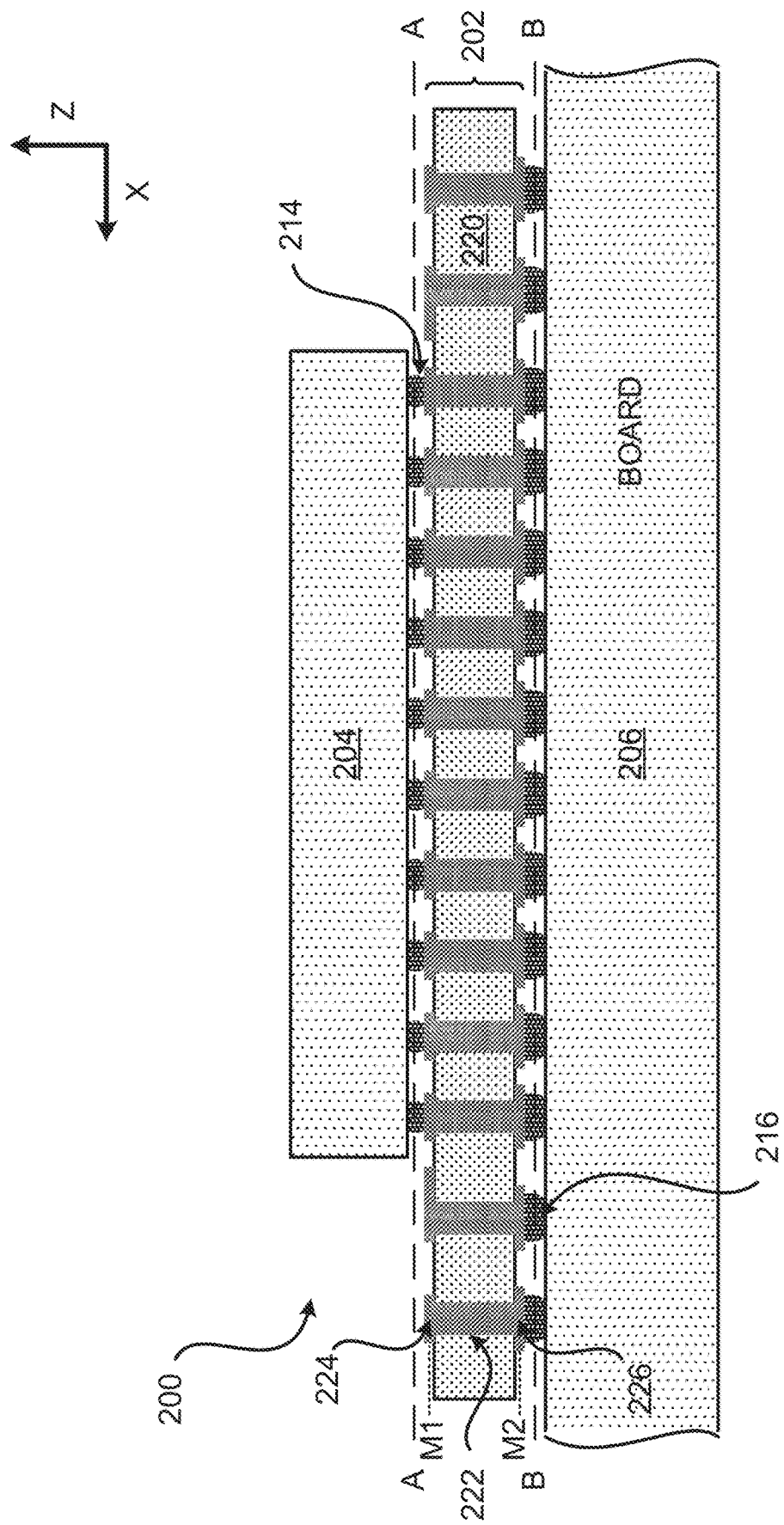
FIG. 2 illustrates a profile view of a device that includes a die, a substrate, and an arrangement of solder interconnects.

FIG. 2 illustrates a profile view of a device 200 that includes a substrate 202 (e.g., package substrate), a die 204 (e.g., first die), a plurality of first solder interconnects 214 and a plurality of second solder interconnects 216. The device 200 may be an integrated device package. The device 200 is coupled to a printed circuit board (PCB) 206 through the plurality of second solder interconnects 216. The die 204 is coupled to the substrate 202 through the plurality of first solder interconnects 214.

The substrate 202 includes a dielectric layer 220. The dielectric layer 220 may be formed by one or more dielectric layers. The dielectric layer 220 may be a core layer. A core layer may include different dielectric materials, such a silicon, glass, quartz, epoxy, or combinations. However, different implementations may use different materials for the dielectric layer 220.

A plurality of vias 222 may be formed in the dielectric layer 220. A first plurality of interconnects 224 may be formed on a first metal layer (M1) of the package substrate (e.g., first metal layer of the dielectric layer 220). The first metal layer (M1) may be a top metal layer that faces the die 204. A second plurality of interconnects 226 may be formed on a second metal layer (M2) of the package substrate (e.g., second metal layer of the dielectric layer 220). The second metal layer (M2) may be a bottom metal layer (M2) that faces the PCB 206, and/or that faces away from the die 204. An interconnect may include vias, pads, and/or traces. As will be further described below an interconnect may include one or more strips. FIG. 2 illustrates that the substrate 202 include only two metal layers (e.g., consists of M1 and M2). In some implementations, the substrate 202 may include more than two metal layers.

As will be further described below, the plurality of first solder interconnects 214 may include several series of first solder interconnects that are arranged in a particular direction (e.g., first direction). A first series of first solder interconnects may be configured to provide a first electrical connection, a second series of first solder interconnects may be configured to provide a second electrical connection, a third series of first solder interconnects may be configured to provide a third electrical connection, and a fourth series of first solder interconnects may be configured to provide a fourth electrical connection. The above are merely examples of how series of first solder interconnects may be configured to provide one or more electrical connections. Different implementations of the series of first solder interconnects may be configured to provide one or more different electrical connections.

Similarly, the plurality of second solder interconnects 216 may include several series of second solder interconnects that are arranged in a particular direction (e.g., second direction). A first series of second solder interconnects may be configured to provide a first electrical connection, a second series of second solder interconnects may be configured to provide a second electrical connection, a third series of second solder interconnects may be configured to provide a third electrical connection, and a fourth series of second solder interconnects may be configured to provide a fourth electrical connection. The above are merely examples of how series of second solder interconnects may be configured to provide one or more electrical connections. Different implementations of the series of second solder interconnects may be configured to provide one or more different electrical connections.

The plurality of vias 222 may include a first plurality of vias configured to provide the first electrical connection, where each via from the first plurality of vias is located vertically between a respective first solder interconnect from the first series of first solder interconnects that vertically overlaps with a respective second solder interconnect from the first series of second solder interconnects. The plurality of vias 222 may include a second plurality of vias configured to provide the second electrical connection, where each via from the second plurality of vias is located vertically between a respective first solder interconnect from the second series of first solder interconnects that vertically overlaps with a respective second solder interconnect from the second series of second solder interconnects.

The plurality of vias 222 may include a third plurality of vias configured to provide the third electrical connection, where each via from the third plurality of vias is located vertically between a respective first solder interconnect from the third series of first solder interconnects that vertically overlaps with a respective second solder interconnect from the third series of second solder interconnects. The plurality of vias 222 may include a fourth plurality of vias configured to provide the fourth electrical connection, where each via from the fourth plurality of vias is located vertically between a respective first solder interconnect from the fourth series of first solder interconnects that vertically overlaps with a respective second solder interconnect from the fourth series of second solder interconnects.

FIG. 3 illustrates an exemplary plan view of the A-A cross section of FIG. 2. The A-A cross section may represent an exemplary plan view of the plurality of first solder interconnects 214 of FIG. 2. It is noted that the A-A cross section may be applicable to other devices described in the disclosure.

The plurality of first solder interconnects 214 includes a first series of first solder interconnects 302, a second series of first solder interconnects 304, and a third series of first solder interconnects 306. A series of solder interconnects may include an arrangement of two or more neighboring solder interconnects. The first series of first solder interconnects 302, the second series of first solder interconnects 304, and the third series of first solder interconnects 306 are arranged in a particular direction (e.g., first direction, Y-direction, along Y axis).

The first series of first solder interconnects 302 may be configured to provide a first electrical connection. The second series of first solder interconnects 304 may be configured to provide a second electrical connection. The third series of first solder interconnects 306 may be configured to provide a third electrical connection. In some implementations, the first electrical connection may be ground, the second electrical connection may be power (e.g., first power, memory power), and the third electrical connection may be power (e.g., second power, processor power, logic power). The first series of first solder interconnects 302, the second series of first solder interconnects 304 and/or the third series of first solder interconnects 306 may be considered part of the core bump area of the device.

FIG. 4 illustrates an exemplary plan view of the B-B cross section of FIG. 2. The B-B cross section may represent an exemplary plan view of the plurality of second solder interconnects 216 of FIG. 2. It is noted that the B-B cross section may be applicable to other devices described in the disclosure.

The plurality of second solder interconnects 216 includes a first series of second solder interconnects 402, a second series of second solder interconnects 404, and a third series of second solder interconnects 406. A series of solder interconnects may include an arrangement of two or more neighboring solder interconnects. The first series of second solder interconnects 402, the second series of second solder interconnects 404, and the third series of second solder interconnects 406 are arranged in a particular direction (e.g., second direction, X-direction, along X axis). The second direction may be orthogonal or perpendicular to the first direction.

The first series of second solder interconnects 402 may be configured to provide a first electrical connection. The second series of second solder interconnects 404 may be configured to provide a second electrical connection. The third series of second solder interconnects 406 may be configured to provide a third electrical connection. In some implementations, the first electrical connection may be ground, the second electrical connection may be power (e.g., first power, memory power), and the third electrical connection may be power (e.g., second power, processor power, logic power). The first series of second solder interconnects 402, the second series of second solder interconnects 404 and/or the third series of second solder interconnects 406 may be considered part of the core bump area of the device.

The plurality of second solder interconnects 216 may include a plurality of second solder interconnects 410. The plurality of second solder interconnects 410 may be arranged in various manner and configuration. The plurality of second solder interconnects 410 may be configured to provide one or more different electrical connections (e.g., power, signal, input/output, ground). The plurality of second solder interconnects 410 may be considered part of the perimeter area (e.g., I/O bump area) of the device.

The plurality of first solder interconnects 214 and the plurality of second solder interconnects 216 may have various sizes. For example, the plurality of first solder interconnects 214 (e.g., upper solder interconnects, top solder interconnects) may have a height in a range of about 40-100 micrometers (μm), and a diameter in a range of about 50-150 micrometers (μm). the plurality of second solder interconnects 216 (e.g., lower solder interconnects, bottom solder interconnects) may have a height in a range of about 75-400 micrometers (μm), and a diameter in a range of about 150-300 micrometers (μm). The above dimensions may apply to other plurality of first solder interconnects (e.g., upper solder interconnects, top solder interconnects) and other plurality of second interconnects (e.g., lower solder interconnects, bottom solder interconnects) described in the disclosure.

Figure 5:
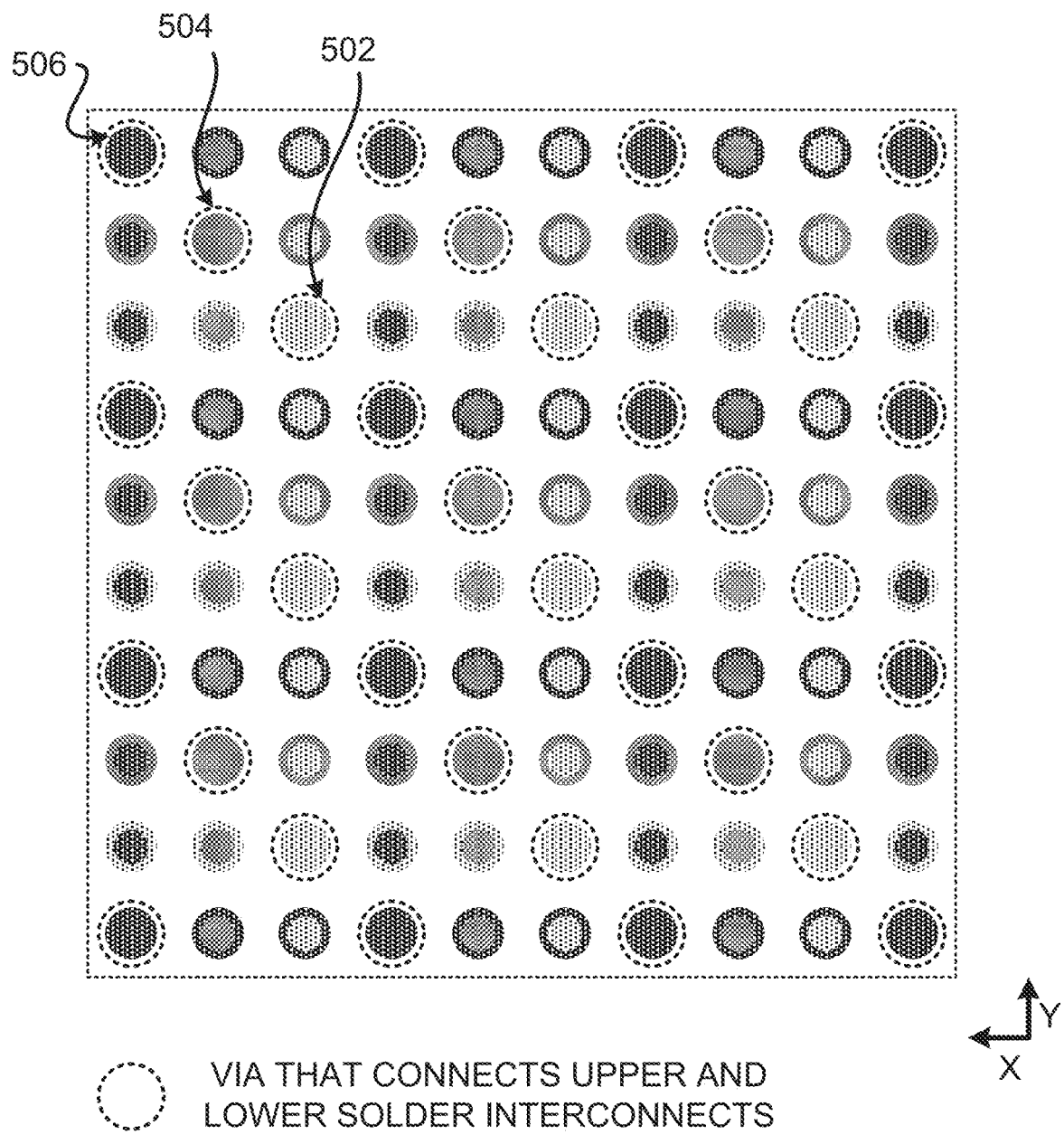
FIG. 5 illustrates a plan view of an overlay of an arrangement of top and bottom solder interconnects.

FIG. 5 illustrates an exemplary plan view of an overlap of the A-A cross section and the B-B cross section of FIG. 2. FIG. 5 illustrates solder interconnects from the plurality of first solder interconnects 214 that overlap with solder interconnects from the plurality of second solder interconnects 216. In particular, FIG. 5 illustrates (i) how solder interconnects from the first series of first solder interconnects 302 may vertically overlap (e.g., partially, completely) with solder interconnects from the first series of second solder interconnects 402, (ii) solder interconnects from the second series of first solder interconnects 304 may vertically overlap with solder interconnects from the second series of second solder interconnects 404, and (iii) solder interconnects from the third series of first solder interconnects 306 may vertically overlap with solder interconnects from the third series of second solder interconnects 406.

When there is a vertical overlap between solder interconnects configured for the same electrical connection, a via (e.g., from the plurality of vias 222) may be located vertically between a top solder interconnect (e.g., solder interconnect from the plurality of solder interconnects 214) and a bottom solder interconnect (e.g., solder interconnect from the plurality of solder interconnects 216). The via may be coupled to a pad that is coupled to a solder interconnect.

As shown in FIG. 5, there is a via 502 that is located vertically between a top solder interconnect from plurality of first solder interconnects 302, and a bottom solder interconnect from the plurality of second solder interconnect 402. There is also a via 504 that is located vertically between a top solder interconnect from plurality of first solder interconnects 304, and a bottom solder interconnect from the plurality of second solder interconnect 404. There is further a via 506 that is located vertically between a top solder interconnect from plurality of first solder interconnects 306, and a bottom solder interconnect from the plurality of second solder interconnect 406. FIG. 5 illustrates other vias where there is an overlap with appropriate top and bottom solder interconnects. FIG. 5 illustrates that these vias are aligned in a diagonal direction.

It is noted that the sizes of the vias that overlap with the top and bottom solder interconnects may be different than what is illustrated in the disclosure. In some implementations, the vias that vertically overlap with the top and bottom solder interconnects may have a size (e.g., width, diameter) that is less, equal or greater than the size of the top and bottom solder interconnects. Thus, the size of the vias shown in FIG. 5 (as well as other vias shown in the disclosure) are merely exemplary. It is noted there may be other vias in the substrate 202.

Figure 8:
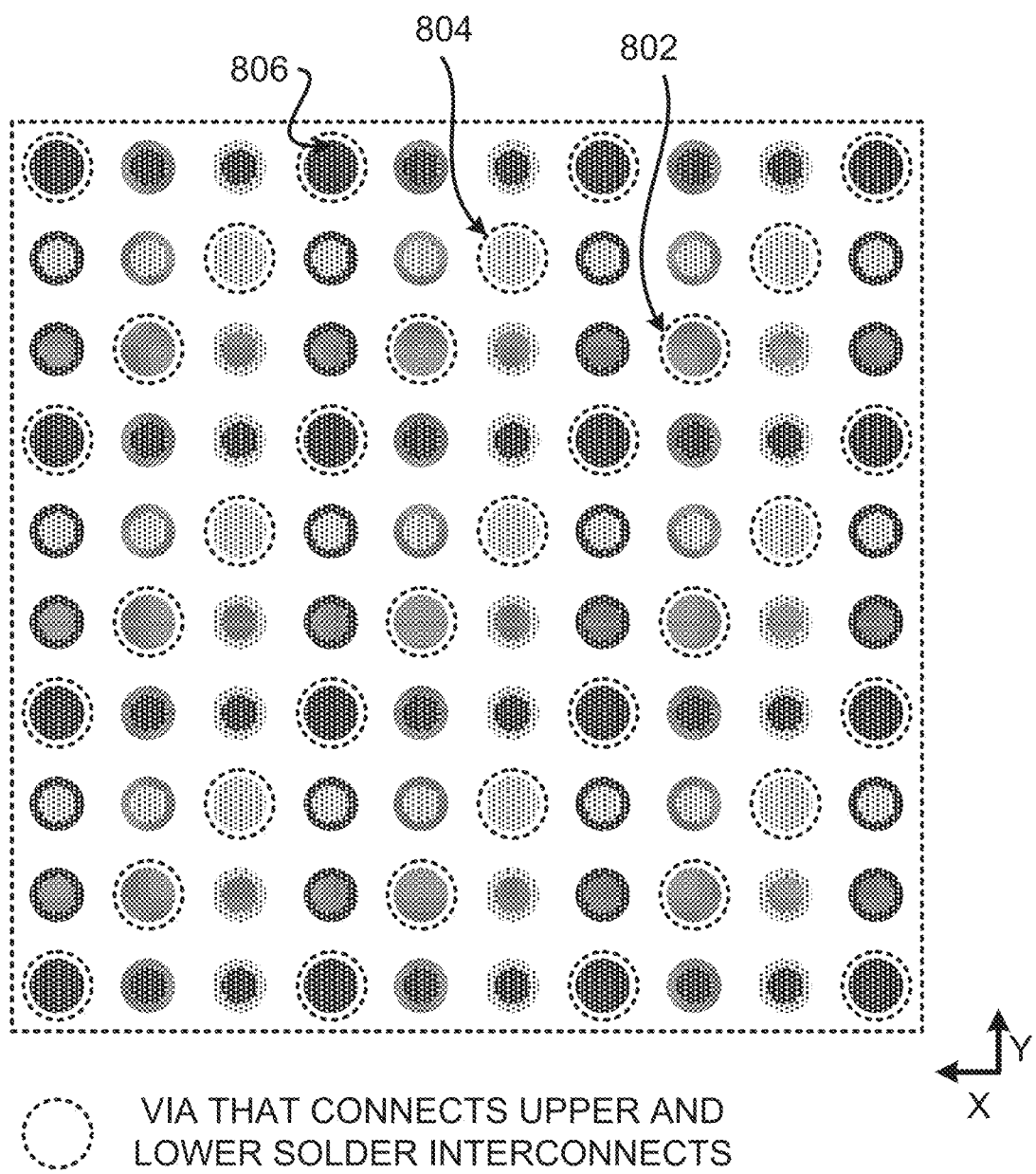
FIG. 8 illustrates a plan view of an overlay of an arrangement of top and bottom solder interconnects.

FIGS. 6-8 illustrate another configuration of solder interconnects and/or vias. FIG. 6 illustrates an exemplary plan view of the A-A cross section of FIG. 2. The A-A cross section may represent an exemplary plan view of the plurality of first solder interconnects 214 of FIG. 2. It is noted that the A-A cross section may be applicable to other devices described in the disclosure.

The plurality of first solder interconnects 214 includes a first series of first solder interconnects 602, a second series of first solder interconnects 604, and a third series of first solder interconnects 606. A series of solder interconnects may include an arrangement of two or more neighboring solder interconnects. The first series of first solder interconnects 602, the second series of first solder interconnects 604, and the third series of first solder interconnects 606 are arranged in a particular direction (e.g., first direction, X-direction, along X axis).

The first series of first solder interconnects 602 may be configured to provide a first electrical connection. The second series of first solder interconnects 604 may be configured to provide a second electrical connection. The third series of first solder interconnects 606 may be configured to provide a third electrical connection. In some implementations, the first electrical connection may be ground, the second electrical connection may be power (e.g., first power, memory power), and the third electrical connection may be power (e.g., second power, processor power, logic power).

FIG. 7 illustrates an exemplary plan view of the B-B cross section of FIG. 2. The B-B cross section may represent an exemplary plan view of the plurality of second solder interconnects 216 of FIG. 2. It is noted that the B-B cross section may be applicable to other devices described in the disclosure.

The plurality of second solder interconnects 216 includes a first series of second solder interconnects 702, a second series of second solder interconnects 704, and a third series of second solder interconnects 706. A series of solder interconnects may include an arrangement of two or more neighboring solder interconnects. The first series of second solder interconnects 702, the second series of second solder interconnects 704, and the third series of second solder interconnects 706 are arranged in a particular direction (e.g., second direction, Y-direction, along Y axis). The second direction may be orthogonal or perpendicular to the first direction.

The first series of second solder interconnects 702 may be configured to provide a first electrical connection. The second series of second solder interconnects 704 may be configured to provide a second electrical connection. The third series of second solder interconnects 706 may be configured to provide a third electrical connection. In some implementations, the first electrical connection may be ground, the second electrical connection may be power (e.g., first power, memory power), and the third electrical connection may be power (e.g., second power, processor power, logic power).

The plurality of second solder interconnects 216 may include a plurality of second solder interconnects 410. The plurality of second solder interconnects 410 may be arranged in various manner and configuration. The plurality of second solder interconnects 410 may be configured to provide one or more different electrical connections (e.g., power, signal, input/output, ground).

FIG. 8 illustrates an exemplary plan view of an overlap of the A-A cross section and the B-B cross section of FIG. 2. FIG. 8 illustrates solder interconnects from the plurality of first solder interconnects 214 that overlap with solder interconnects from the plurality of second solder interconnects 216. In particular, FIG. 8 illustrates (i) how solder interconnects from the first series of first solder interconnects 602 may vertically overlap (e.g., partially, completely) with solder interconnects from the first series of second solder interconnects 702, (ii) solder interconnects from the second series of first solder interconnects 604 may vertically overlap with solder interconnects from the second series of second solder interconnects 704, and (iii) solder interconnects from the third series of first solder interconnects 606 may vertically overlap with solder interconnects from the third series of second solder interconnects 706.

When there is a vertical overlap between solder interconnects configured for the same electrical connection, a via (e.g., from the plurality of vias 222) may be located vertically between a top solder interconnect (e.g., solder interconnect from the plurality of solder interconnects 214) and a bottom solder interconnect (e.g., solder interconnect from the plurality of solder interconnects 216). The via may be coupled to a pad that is coupled to a solder interconnect.

As shown in FIG. 8, there is a via 802 that is located vertically between a top solder interconnect from plurality of first solder interconnects 602, and a bottom solder interconnect from the plurality of second solder interconnect 702. There is also a via 804 that is located vertically between a top solder interconnect from plurality of first solder interconnects 604, and a bottom solder interconnect from the plurality of second solder interconnect 704. There is further a via 806 that is located vertically between a top solder interconnect from plurality of first solder interconnects 606, and a bottom solder interconnect from the plurality of second solder interconnect 706. FIG. 8 illustrates other vias where there is an overlap with appropriate top and bottom solder interconnects. FIG. 8 illustrates that these vias are aligned in a diagonal direction.

It is noted that the sizes of the vias that overlap with the top and bottom solder interconnects may be different than what is illustrated in the disclosure. In some implementations, the vias that vertically overlap with the top and bottom solder interconnects may have a size (e.g., width, diameter) that is less, equal or greater than the size of the top and bottom solder interconnects. Thus, the size of the vias shown in FIG. 8 (as well as other vias shown in disclosure) are merely exemplary. It is noted there may be other vias in the substrate 202.

Figure 11:
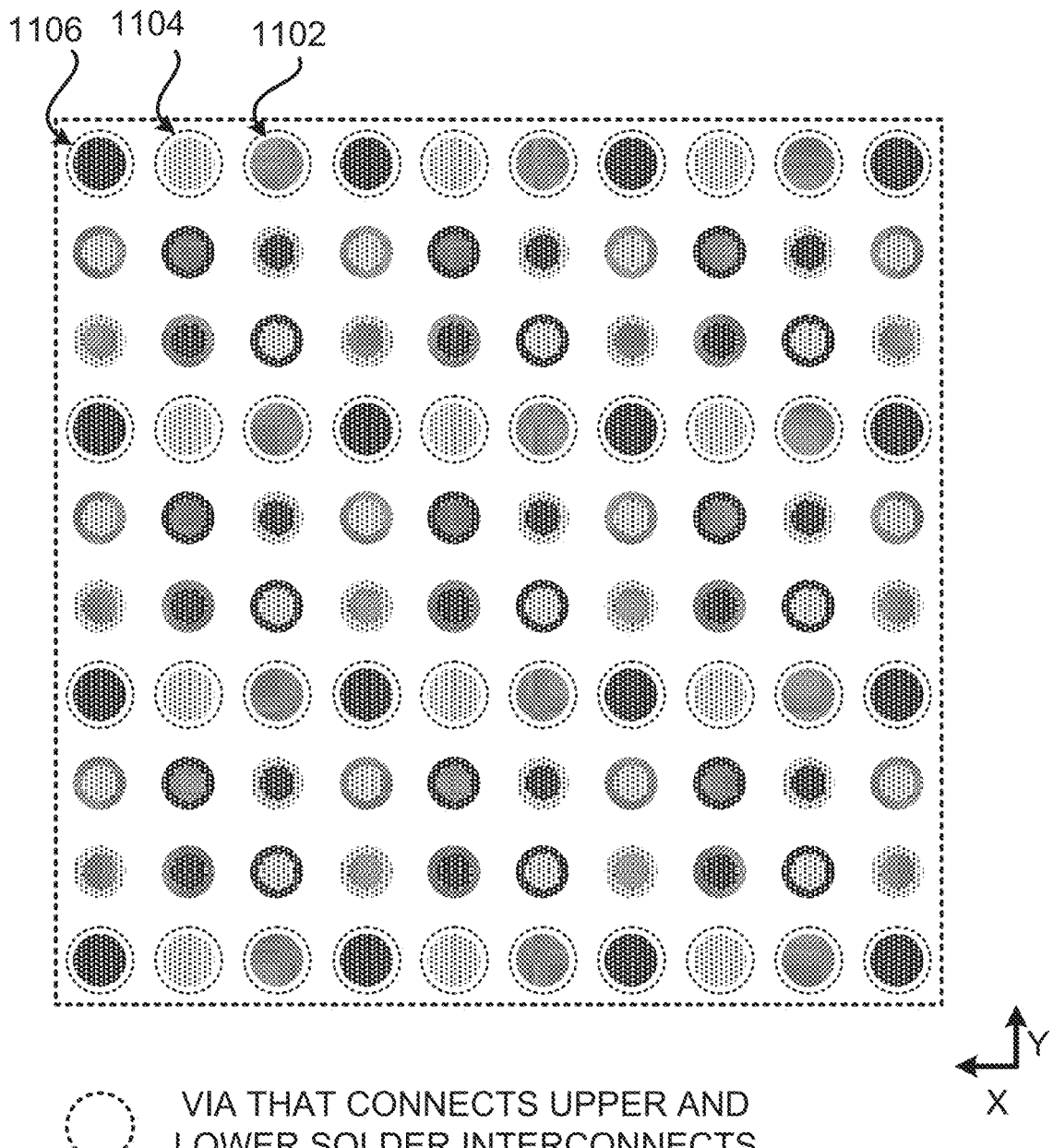
FIG. 11 illustrates a plan view of an overlay of an arrangement of top and bottom solder interconnects.

FIGS. 9-11 illustrate another configuration of solder interconnects and/or vias. FIG. 9 illustrates an exemplary plan view of the A-A cross section of FIG. 2. The A-A cross section may represent an exemplary plan view of the plurality of first solder interconnects 214 of FIG. 2. It is noted that the A-A cross section may be applicable to other devices described in the disclosure.

The plurality of first solder interconnects 214 includes a first series of first solder interconnects 902, a second series of first solder interconnects 904, and a third series of first solder interconnects 906. A series of solder interconnects may include an arrangement of two or more neighboring solder interconnects. The first series of first solder interconnects 902, the second series of first solder interconnects 904, and the third series of first solder interconnects 906 are arranged in a particular direction (e.g., first direction, diagonal direction, 45 degrees).

The first series of first solder interconnects 902 may be configured to provide a first electrical connection. The second series of first solder interconnects 904 may be configured to provide a second electrical connection. The third series of first solder interconnects 906 may be configured to provide a third electrical connection. In some implementations, the first electrical connection may be ground, the second electrical connection may be power (e.g., first power, memory power), and the third electrical connection may be power (e.g., second power, processor power, logic power).

FIG. 10 illustrates an exemplary plan view of the B-B cross section of FIG. 2. The B-B cross section may represent an exemplary plan view of the plurality of second solder interconnects 216 of FIG. 2. It is noted that the B-B cross section may be applicable to other devices described in the disclosure.

The plurality of second solder interconnects 216 includes a first series of second solder interconnects 1002, a second series of second solder interconnects 1004, and a third series of second solder interconnects 1006. A series of solder interconnects may include an arrangement of two or more neighboring solder interconnects. The first series of second solder interconnects 1002, the second series of second solder interconnects 1004, and the third series of second solder interconnects 1006 are arranged in a particular direction (e.g., second direction, diagonal direction, 135 degrees, −45 degrees). The second direction may be orthogonal or perpendicular to the first direction.

The first series of second solder interconnects 1002 may be configured to provide a first electrical connection. The second series of second solder interconnects 1004 may be configured to provide a second electrical connection. The third series of second solder interconnects 1006 may be configured to provide a third electrical connection. In some implementations, the first electrical connection may be ground, the second electrical connection may be power (e.g., first power, memory power), and the third electrical connection may be power (e.g., second power, processor power, logic power).

The plurality of second solder interconnects 216 may include a plurality of second solder interconnects 410. The plurality of second solder interconnects 410 may be arranged in various manner and configuration. The plurality of second solder interconnects 410 may be configured to provide one or more different electrical connections (e.g., power, signal, input/output, ground).

FIG. 11 illustrates an exemplary plan view of an overlap of the A-A cross section and the B-B cross section of FIG. 2. FIG. 11 illustrates solder interconnects from the plurality of first solder interconnects 214 that overlap with solder interconnects from the plurality of second solder interconnects 216. In particular, FIG. 11 illustrates (i) how solder interconnects from the first series of first solder interconnects 902 may vertically overlap (e.g., partially, completely) with solder interconnects from the first series of second solder interconnects 1002, (ii) solder interconnects from the second series of first solder interconnects 904 may vertically overlap with solder interconnects from the second series of second solder interconnects 1004, and (iii) solder interconnects from the third series of first solder interconnects 906 may vertically overlap with solder interconnects from the third series of second solder interconnects 1006.

When there is a vertical overlap between solder interconnects configured for the same electrical connection, a via (e.g., from the plurality of vias 222) may be located vertically between a top solder interconnect (e.g., solder interconnect from the plurality of solder interconnects 214) and a bottom solder interconnect (e.g., solder interconnect from the plurality of solder interconnects 216). The via may be coupled to a pad that is coupled to a solder interconnect.

As shown in FIG. 11, there is a via 1102 that is located vertically between a top solder interconnect from plurality of first solder interconnects 902, and a bottom solder interconnect from the plurality of second solder interconnect 1002. There is also a via 1104 that is located vertically between a top solder interconnect from plurality of first solder interconnects 904, and a bottom solder interconnect from the plurality of second solder interconnect 1004. There is further a via 1106 that is located vertically between a top solder interconnect from plurality of first solder interconnects 906, and a bottom solder interconnect from the plurality of second solder interconnect 1006. FIG. 8 illustrates other vias where there is an overlap with appropriate top and bottom solder interconnects. FIG. 8 illustrates that these vias are aligned in a X direction. It is noted there may be other vias in the substrate 202. In some implementations, the vias may be aligned in a different direction (e.g., Y direction, diagonal).

It is noted that when a top solder interconnect from the first plurality of solder interconnects 214 vertically overlaps (e.g., partially, fully) with a bottom solder interconnect from the second plurality of solder interconnects 216, and the top solder interconnect is configured to provide a different electrical connection than the electrical connection of the bottom solder interconnect, there may not be a via that is located vertically between the top solder interconnect and the bottom solder interconnect. In such instances, the top solder interconnect may be coupled to a pad, trace and via that is located somewhere else, but the via is not necessarily located vertically under the top solder interconnect. Similarly, in such instances, the bottom solder interconnect may be coupled to a pad, trace and via that is located somewhere else, but the via is not necessarily located vertically over the bottom solder interconnect.

It is noted that the sizes of the vias that overlap with the top and bottom solder interconnects may be different than what is illustrated in the disclosure. In some implementations, the vias that vertically overlap with the top and bottom solder interconnects may have a size (e.g., width, diameter) that is less, equal or greater than the size of the top and bottom solder interconnects. Thus, the size of the vias shown in FIG. 11 (as well as other vias shown in disclosure) are merely exemplary.

Figure 12A:
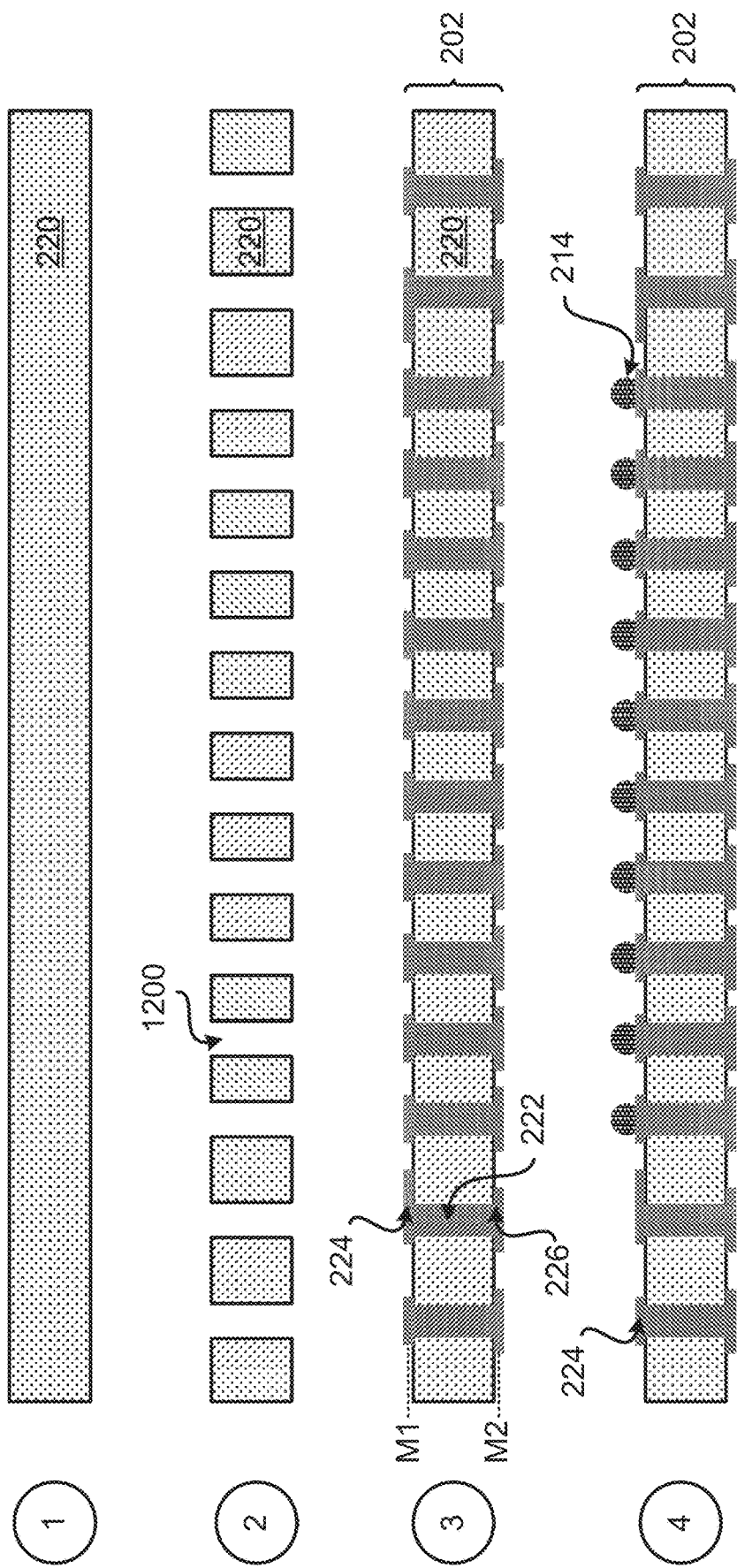
FIG. 12 (comprising FIGS. 12A-12B) illustrates an exemplary sequence for fabricating a device that includes a die, a substrate, and an arrangement of solder interconnects.
Figure 12B:
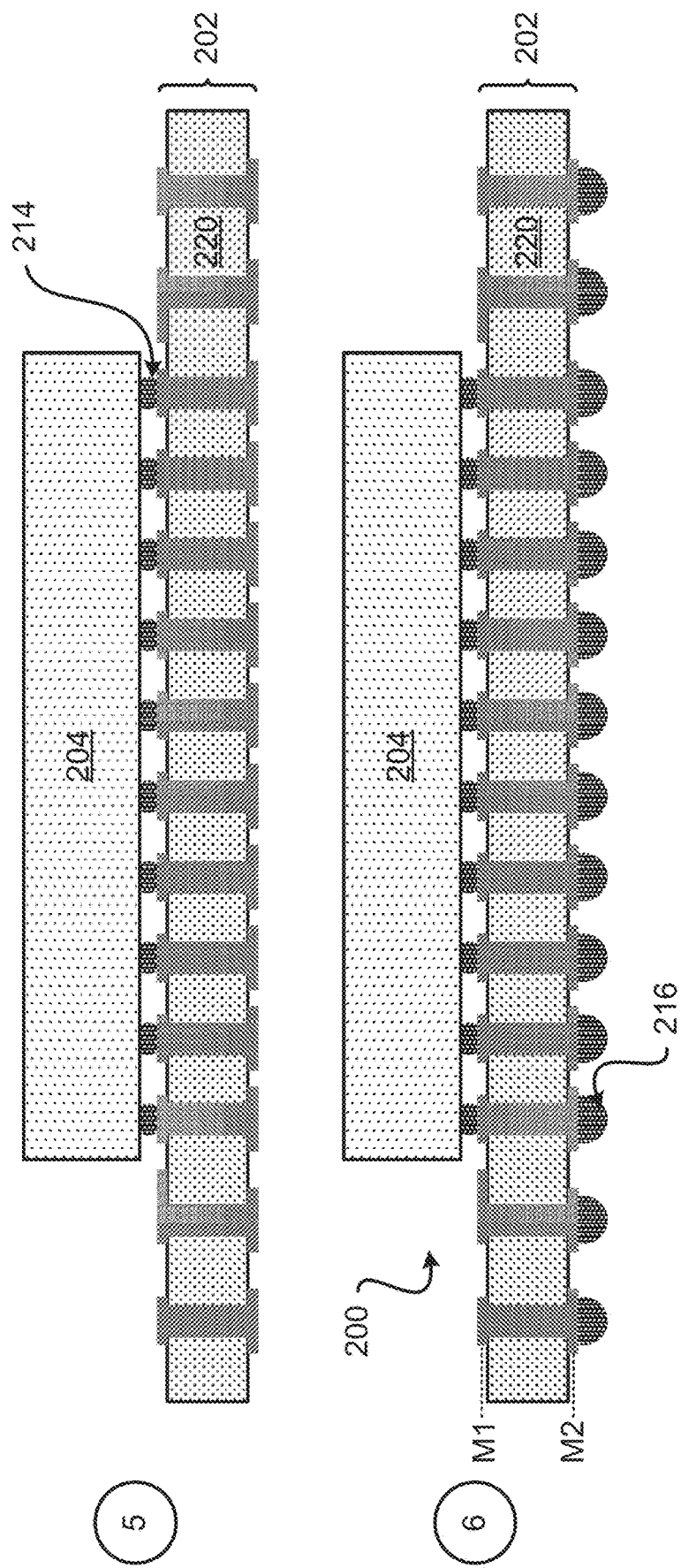

Exemplary Sequence for Fabricating a Device Comprising an Arrangement of Solder Interconnects FIG. 12 (which includes FIGS. 12A-12B) illustrates an exemplary sequence for providing or fabricating a device. In some implementations, the sequence of FIG. 12 may be used to provide or fabricate the device 200 of FIG. 2. However, the sequence of FIG. 12 may be used to fabricate any of the device that includes the arrangement of solder interconnects described in the disclosure.

It should be noted that the sequence of FIG. 12 may combine one or more stages in order to simplify and/or clarify the sequence for providing or fabricating a device. In some implementations, the order of the processes may be changed or modified. In some implementations, one or more of processes may be replaced or substituted without departing from the spirit of the disclosure.

Stage 1, as shown in FIG. 12A, illustrates a dielectric layer 220 being provided. The dielectric layer 220 may be a core layer. The dielectric layer 220 may include different dielectric materials, such a silicon, glass, quartz, epoxy, or combinations thereof.

Stage 2 illustrates a state after a plurality of cavities 1200 is formed through the dielectric layer 220. In some implementations, the cavities 1200 are formed using a drilling process (e.g., mechanical drilling). The cavities 1200 may be formed such that the cavities have side walls that approximately vertical to a first surface and/or a second surface of the dielectric layer 220.

Stage 3 illustrates a state after a metal layer (e.g., copper) is formed and patterned over the first surface and second surface of the dielectric layer 220, and the surface of the cavities 1200. A plating process may be used to form the metal layer. The metal layer may include a seed layer and/or a metal layer. Thus, the metal layer may include more than one metal layer. The metal layer may define the plurality of vias 222, the first plurality of interconnects 224, and the second plurality of interconnects 226.

Stage 4 illustrates a plurality of first solder interconnects 214 is provided over the first plurality of interconnects 224.

Stage 5, as shown in FIG. 12B, illustrates a state a die 204 is coupled to the substrate 202 through the plurality of first solder interconnects 214. In some implementations, several dies may be coupled to the substrate 202.

Stage 6 illustrates a state after a plurality of second solder interconnects 216 is provided over the second plurality of interconnects 226. In some implementations, the device 200 that includes the die 204 and the substrate 202 may be coupled to a board (e.g., PCB 206) through the plurality of second solder interconnects 216.

Figure 13:
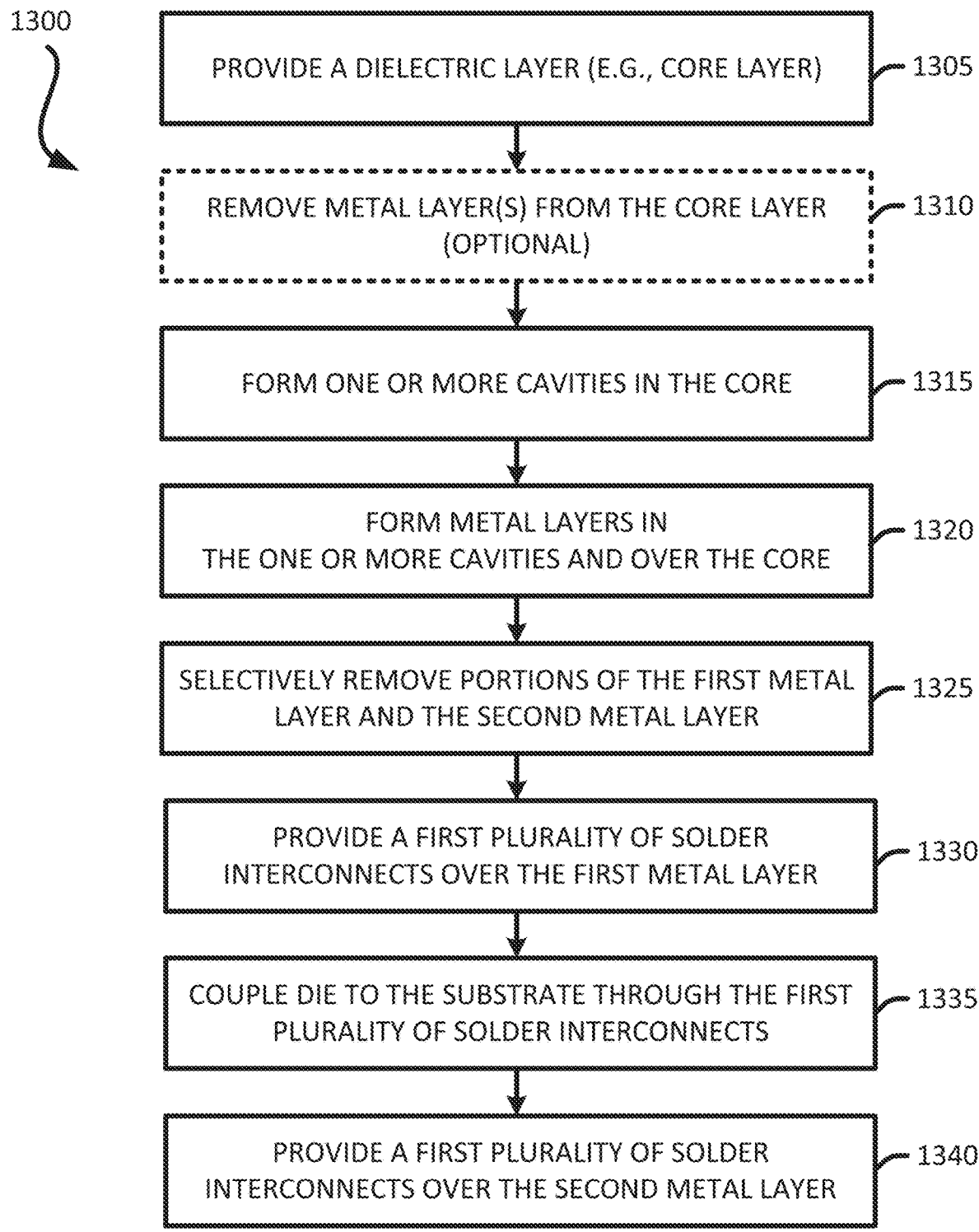
FIG. 13 illustrates an exemplary flow diagram of a method for fabricating a device that includes a die, a substrate, and an arrangement of solder interconnects.

Exemplary Flow Diagram of a Method for Fabricating a Device Comprising an Arrangement of Solder Interconnects In some implementations, fabricating a device comprising an arrangement of solder interconnects includes several processes. FIG. 13 illustrates an exemplary flow diagram of a method 1300 for providing or fabricating device comprising an arrangement of solder interconnects. In some implementations, the method 1300 of FIG. 13 may be used to provide or fabricate the device 200 of FIG. 2, or any device described in the present disclosure.

It should be noted that the sequence of FIG. 13 may combine one or more processes in order to simplify and/or clarify the method for providing or fabricating a device comprising an arrangement of solder interconnects. In some implementations, the order of the processes may be changed or modified.

The method 1300 provides (at 1305) a dielectric layer 220. The dielectric layer may be a core layer. The dielectric layer 220 may include different dielectric materials, such a silicon, glass, quartz, epoxy, or combinations thereof.

The method 1300 may optionally remove (at 1310) metal layers over the core layer. In some implementations, the core layer may come with one or more metal layers formed over the first and/or second surfaces of the core layer. In such instances, the metal layer may be removed (e.g., by using an etching process).

The method forms (at 1315) a plurality of cavities through the dielectric layer 220. The plurality of cavities (e.g., 1200) may be formed using a laser process or a drilling process, as described in FIGS. 12A-12B.

The method forms (at 1320) a metal layer (e.g., 500) over the first surface and second surface of the dielectric layer 220, and the surface of the cavities (e.g., 1200). A plating process may be used to form the metal layer. The metal layer may include a seed layer and/or a metal layer.

The method selectively removes (at 1325) portions of the metal layer. Stage 3 of FIG. 12A, illustrates a state after the metal layer has been patterned to form and/or define interconnects (e.g., vias, traces, pads) for the substrate. For example, the plurality of vias 222, the first plurality of interconnects 224 and the second plurality of interconnects 226 may be formed.

The method provides (at 1330) a plurality of first solder interconnects 214 over the first plurality of interconnects 224.

The method couples (at 1335) a die (e.g., 204) to the substrate through the plurality of first solder interconnects 214.

The method provides (at 1340) a plurality of second solder interconnects 216 over the second plurality of interconnects 226.

Exemplary Device Comprising an Arrangement of Solder Interconnects

Figure 14:
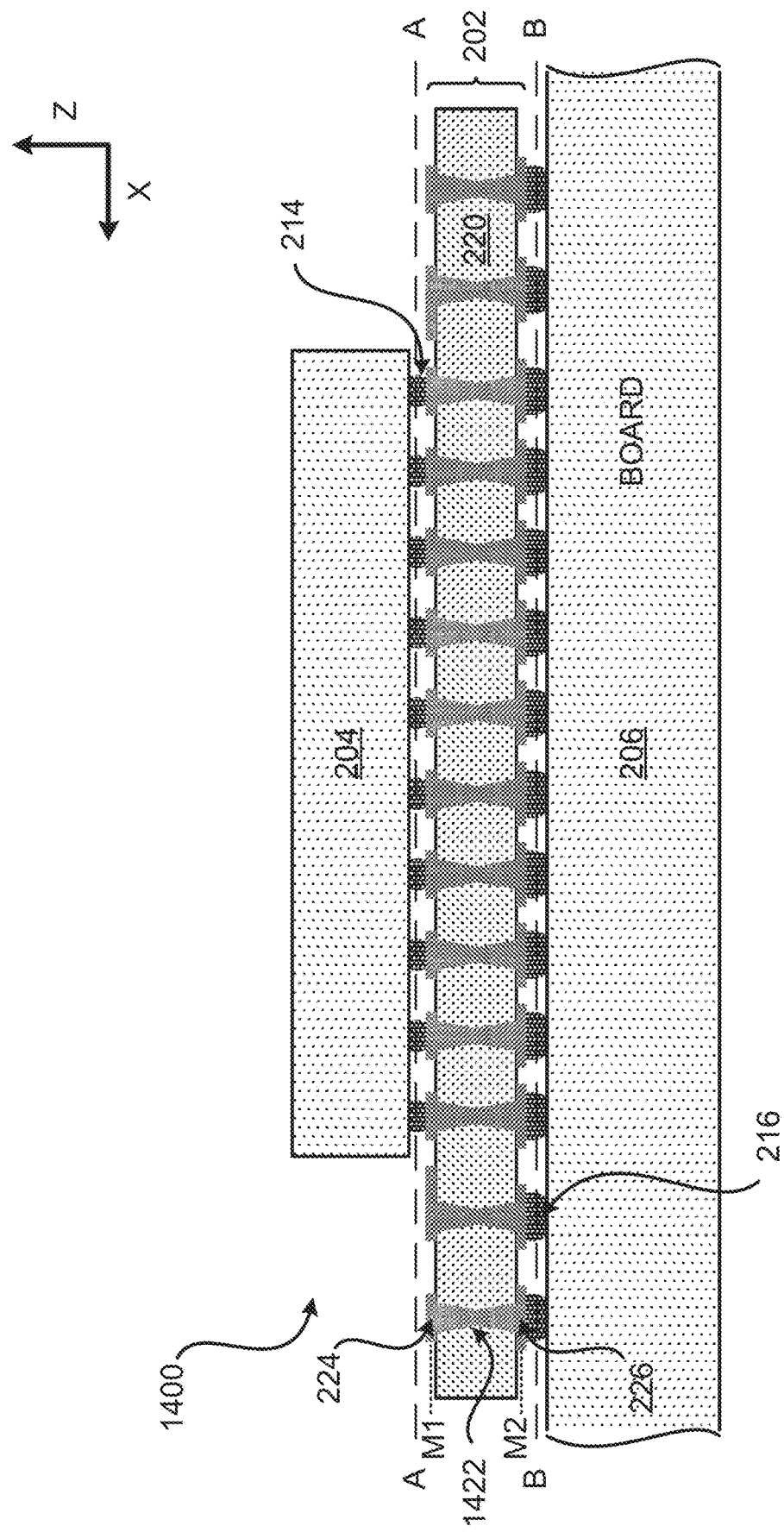
FIG. 14 illustrates a profile view of a device that includes a die, a substrate, and an arrangement of solder interconnects.

FIG. 14 illustrates a profile view of a device 1400 that includes a substrate 202 (e.g., package substrate), a die 204 (e.g., first die), a plurality of first solder interconnects 214 and a plurality of second solder interconnects 216. The device 1400 may be integrated device package. The device 1400 is coupled to a printed circuit board (PCB) through the plurality of second solder interconnects 216. The die 204 is coupled to the substrate 202 through the plurality of first solder interconnects 214. A plurality of vias 1422 may be formed in the dielectric layer 220.

The device 1400 may be similar to the device 200 as described in FIG. 2. The plurality of vias 1422 is similar to the plurality of vias 222. As shown in FIG. 14, the plurality of vias 1422 has a different shape than the plurality of vias 222. In particular, the plurality of vias 1422 has diagonal or non-vertical walls.

Exemplary Device Comprising an Arrangement of Solder Interconnects and Strips

Figure 15:
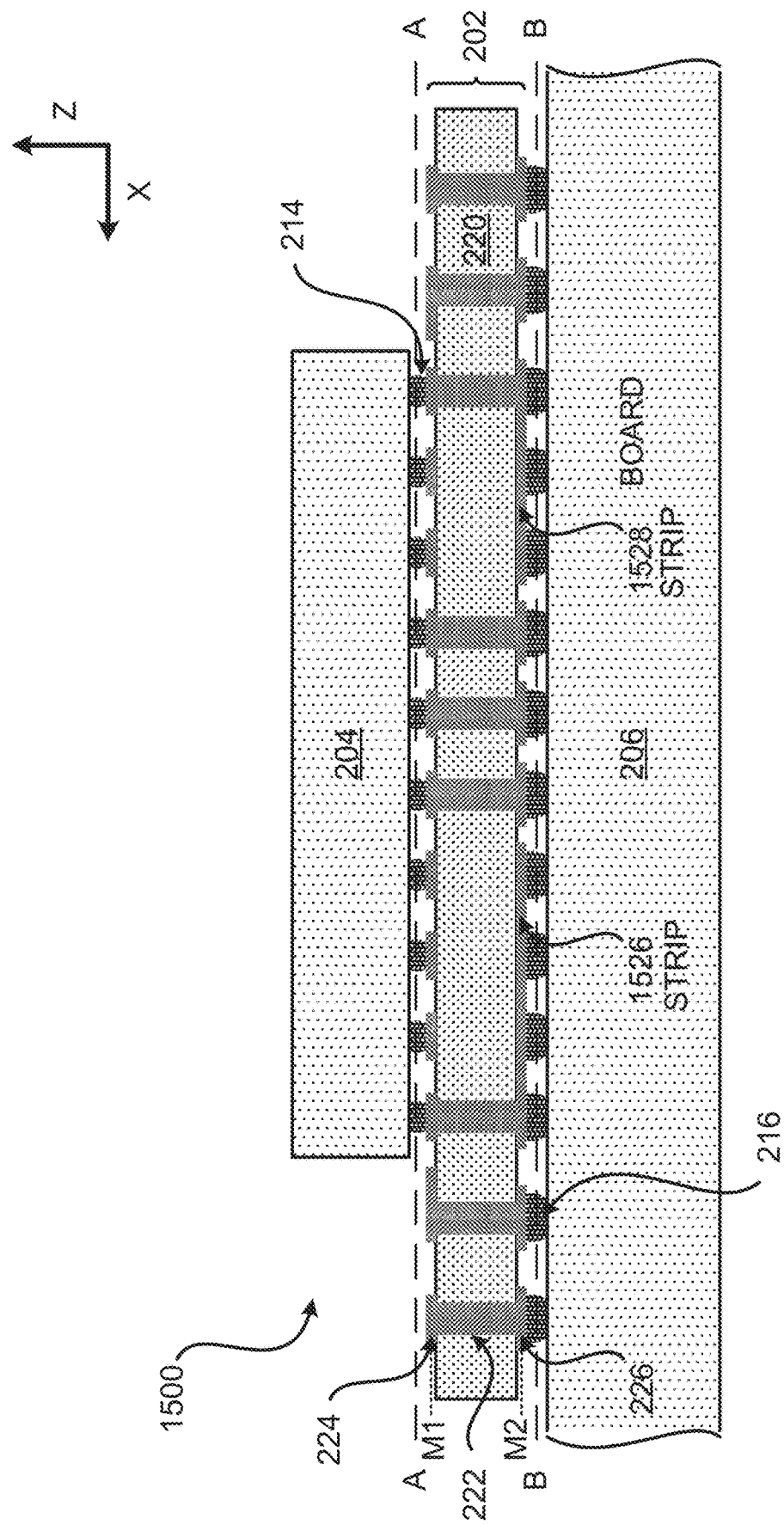
FIG. 15 illustrates a profile view of a device that includes a die, a substrate, strips and an arrangement of solder interconnects.

FIG. 15 illustrates a profile view of a device 1500 that includes a substrate 202 (e.g., package substrate), a die 204 (e.g., first die), a plurality of first solder interconnects 214 and a plurality of second solder interconnects 216. The device 1500 may be an integrated device package. The device 1500 is coupled to a printed circuit board (PCB) 206 through the plurality of second solder interconnects 216. The device 1500 may include the PCB 206. The die 204 is coupled to the substrate 202 through the plurality of first solder interconnects 214. A plurality of vias 222 may be formed in the dielectric layer 220.

The device 1500 may be similar to the device 200 as described in FIG. 2. As shown in FIG. 15, a first plurality of interconnects 224 may be formed on a first metal layer (M1) of the package substrate (e.g., first metal layer of the dielectric layer 220). The first metal layer (M1) may be a top metal layer that faces the die 204. A second plurality of interconnects 226 may be formed on a second metal layer (M2) of the package substrate (e.g., second metal layer of the dielectric layer 220). The second metal layer (M2) may be a bottom metal layer (M2) that faces the PCB 206, and/or that faces away from the die 204. An interconnect may include vias, pads, and/or traces.

The second plurality of interconnects 226 includes at least one strip 1526 formed on the second metal layer (M2) of the substrate 202. A strip may be an interconnect that has larger dimensions than a pad and/or a trace. For example, multiple vias and/or multiple solder interconnects may be coupled to an individual strip. In some implementations, a strip may have a length that is at least twice a wide as a trace or via, to accommodate several vias and/or solder interconnects to be coupled to the strip.

FIG. 16 illustrates an exemplary plan view of the A-A cross section overlay with strips on the M2 layer of FIG. 15. The A-A cross section may represent an exemplary plan view of the plurality of first solder interconnects 214 of FIG. 15. As shown in FIG. 16, the M2 layer of the substrate 202 includes the strip 1526, a strip 1622, a strip 1624, and a strip 1626. The strip 1526, the strip 1622, the strip 1624, and the strip 1626 are aligned in a particular direction (e.g., first direction, Y-axis, Y direction). The strips may have different width and/or length.

The plurality of first solder interconnects 214 includes a first series of first solder interconnects 1602, a second series of first solder interconnects 1604, and a third series of first solder interconnects 1606. A series of solder interconnects may include an arrangement of two or more neighboring solder interconnects. The first series of first solder interconnects 1602, the second series of first solder interconnects 1604, and the third series of first solder interconnects 1606 are arranged in a particular direction (e.g., first direction, X-direction, along X axis).

As shown in FIG. 16, some of the solder interconnects may vertically overlap with one of the strips. The first series of first solder interconnects 1602 and the strip 1526 may be configured to provide a first electrical connection. The second series of first solder interconnects 1604, the strip 1622 and the strip 1624 may be configured to provide a second electrical connection. The third series of first solder interconnects 1606 and the strip 1626 may be configured to provide a third electrical connection. In some implementations, the first electrical connection may be ground, the second electrical connection may be power (e.g., first power, memory power), and the third electrical connection may be power (e.g., second power, processor power, logic power). The first series of first solder interconnects 1602, the strip 1526, the second series of first solder interconnects 1604, the strip 1622, the strip 1624, the third series of first solder interconnects 1606 and/or the strip 1626 may be considered part of the core bump area of the device.

FIG. 17 illustrates an exemplary plan view of the B-B cross section overlay with strips on the M2 layer of FIG. 15. The B-B cross section may represent an exemplary plan view of the plurality of second solder interconnects 216 of FIG. 15. It is noted that the B-B cross section may be applicable to other devices described in the disclosure.

The plurality of second solder interconnects 216 includes a first series of second solder interconnects 1702, a second series of second solder interconnects 1704, and a third series of second solder interconnects 1706. A series of solder interconnects may include an arrangement of two or more neighboring solder interconnects. The first series of second solder interconnects 1702, the second series of second solder interconnects 1704, and the third series of second solder interconnects 1706 are arranged in a particular direction (e.g., second direction, Y-direction, along Y axis). The second direction may be orthogonal or perpendicular to the first direction.

As shown in FIG. 17, some of the solder interconnects may vertically overlap with one of the strips. The first series of second solder interconnects 1702 may be configured to provide a first electrical connection. One or more of the second solder interconnects 1702 may be coupled to the strip 1526. The second series of second solder interconnects 1704 may be configured to provide a second electrical connection.

One or more of the second solder interconnects 1704 may be coupled to the strip 1622 and/or the strip 1624. The third series of second solder interconnects 1706 may be configured to provide a third electrical connection. One or more of the second solder interconnects 1706 may be coupled to the strip 1626. In some implementations, the first electrical connection may be ground, the second electrical connection may be power (e.g., first power, memory power), and the third electrical connection may be power (e.g., second power, processor power, logic power). The first series of second solder interconnects 1702, the strip 1526, the second series of second solder interconnects 1704, the strip 1622, the third series of second solder interconnects 1706 and/or the strip 1626 may be considered part of the core bump area of the device.

FIG. 17 illustrates that one or more second solder interconnects 216 has been removed and/or is missing in areas where the strips may overlap with multiple second solder interconnects 216., leaving at least one second solder interconnect from the second solder interconnects 216 to overlap with the particular strip.

The plurality of second solder interconnects 216 may include a plurality of second solder interconnects 1710. The plurality of second solder interconnects 1710 may be arranged in various manner and configuration. The plurality of second solder interconnects 1710 may be configured to provide one or more different electrical connections (e.g., power, signal, input/output, ground, misc). The plurality of second solder interconnects 1710 may be considered part of the perimeter area (e.g., I/O bump area) of the device.

When there is a vertical overlap between solder interconnects and a strip configured for the same electrical connection, a via (e.g., from the plurality of vias 222) may be located vertically between a top solder interconnect (e.g., solder interconnect from the plurality of solder interconnects 214) and a strip (e.g., 1526, 1622, 1624, 1626). The via may be coupled to a strip that is coupled to a solder interconnect.

As shown in FIG. 17, there is a via that is located vertically between a top solder interconnect from plurality of first solder interconnects 1602, and the strip 1526. There is also a via that is located vertically between a top solder interconnect from plurality of first solder interconnects 304, and the strip 1624. There is further a via that is located vertically between a top solder interconnect from plurality of first solder interconnects 1606, and the strip 1626. FIG. 17 illustrates other vias where there is an overlap with appropriate top solder interconnects and a strip.

It is noted that the strips may have different shapes and sizes, and can be aligned along different directions, or combinations of different directions (e.g., first direction, second direction, diagonal, X direction, Y direction). For example, one or more strips may have a pitch that is in range of about 200-700 micrometers (μm). In some implementations, the pitch of the plurality of second solder interconnects 216 may have a pitch in range of about 200-350 micrometers (μm). In some implementations, one or more strips may have a pitch that is equivalent to 1 to 2 pitches of the plurality of second solder interconnects 216. One or more strips may be located in an area where one or more second solder interconnects 216 have been removed and/or is missing (e.g., as shown in FIG. 17). In some implementations, the minimum spacing between strips may be in a range of about 30-50 micrometers (μm).

In some implementations, a series of solder interconnects may not be perfectly aligned in a particular direction. In some implementations, a series of solder interconnects may include solder interconnects that are offset from other solder interconnects.

FIG. 18 illustrates a first series of first solder interconnects 1802 that include offset solder interconnects, a second series of first solder interconnects 1804 that include offset solder interconnects, and a third series of first solder interconnects 1806 that include offset solder interconnects. The first series, the second series and the third series are aligned along a particular direction (e.g., Y-axis, Y direction).

FIG. 19 illustrates a first series of second solder interconnects 1902 that include offset solder interconnects, a second series of second solder interconnects 1904 that include offset solder interconnects, and a third series of second solder interconnects 1906 that include offset solder interconnects. The first series, the second series and the third series are aligned along a particular direction (e.g., X-axis, X direction). The offset solder interconnects may be used to provide enough spacing between solder interconnects.

The plurality of second solder interconnects 216 may include a plurality of second solder interconnects 1910. The plurality of second solder interconnects 1910 may be arranged in various manner and configuration. The plurality of second solder interconnects 1910 may be configured to provide one or more different electrical connections (e.g., power, signal, input/output, ground, misc).

Figure 20:
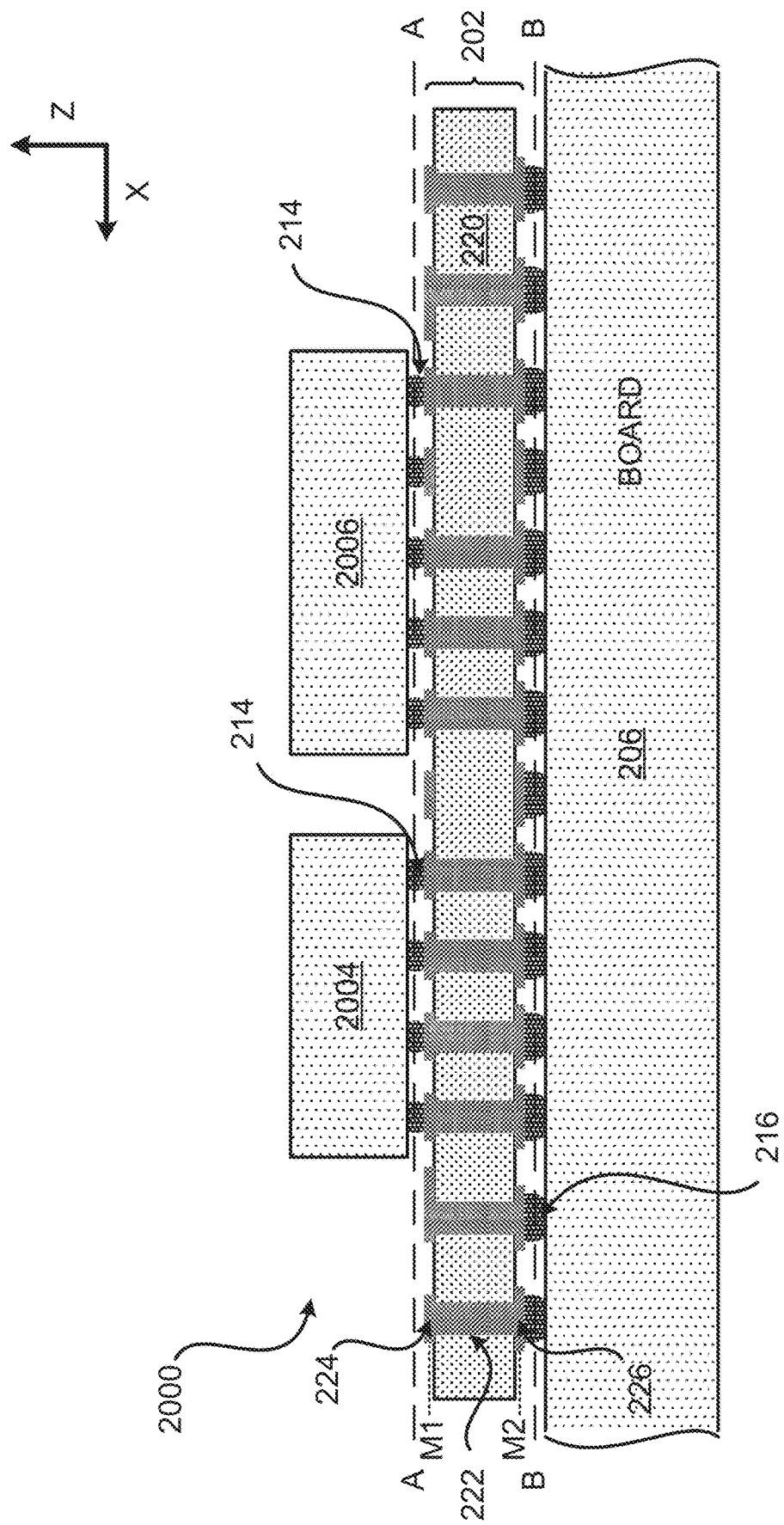
FIG. 20 illustrates a profile view of a device that includes several dies, a substrate, and an arrangement of solder interconnects.

As mentioned above, a device may include more than one die that is coupled to a substrate. FIG. 20 illustrates a device 2000 that includes a first die 2004 and a second die 2006 that are coupled to the substrate 202. The device 2000 may be similar to the device 200 of FIG. 2. The first die 2004 and the second die 2006 may be coupled to the substrate 202 through a first plurality of solder interconnects 214.

FIG. 21 illustrates an exemplary plan view of the A-A cross section of FIG. 20. The A-A cross section may represent an exemplary plan view of the plurality of first solder interconnects 214 of FIG. 20. It is noted that the A-A cross section may be applicable to other devices described in the disclosure. FIG. 21 illustrates that the device 2000 includes the first die 2004, the second die 2006, the third die 2104, and the fourth die 2106.

The plurality of first solder interconnects 214 includes a first series of first solder interconnects 302, a second series of first solder interconnects 304, and a third series of first solder interconnects 306. A series of solder interconnects may include an arrangement of two or more neighboring solder interconnects. The first series of first solder interconnects 302, the second series of first solder interconnects 304, and the third series of first solder interconnects 306 are arranged in a particular direction (e.g., first direction, Y-direction, along Y axis).

The first series of first solder interconnects 302 may be configured to provide a first electrical connection. The second series of first solder interconnects 304 may be configured to provide a second electrical connection. The third series of first solder interconnects 306 may be configured to provide a third electrical connection. In some implementations, the first electrical connection may be ground, the second electrical connection may be power (e.g., first power, memory power), and the third electrical connection may be power (e.g., second power, processor power, logic power).

FIG. 22 illustrates an exemplary plan view of the B-B cross section of FIG. 20. The B-B cross section may represent an exemplary plan view of the plurality of second solder interconnects 216 of FIG. 20. It is noted that the B-B cross section may be applicable to other devices described in the disclosure.

The plurality of second solder interconnects 216 includes a first series of second solder interconnects 402, a second series of second solder interconnects 404, and a third series of second solder interconnects 406. A series of solder interconnects may include an arrangement of two or more neighboring solder interconnects. The first series of second solder interconnects 402, the second series of second solder interconnects 404, and the third series of second solder interconnects 406 are arranged in a particular direction (e.g., second direction, X-direction, along X axis). The second direction may be orthogonal or perpendicular to the first direction.

The first series of second solder interconnects 402 may be configured to provide a first electrical connection. The second series of second solder interconnects 404 may be configured to provide a second electrical connection. The third series of second solder interconnects 406 may be configured to provide a third electrical connection. In some implementations, the first electrical connection may be ground, the second electrical connection may be power (e.g., first power, memory power), and the third electrical connection may be power (e.g., second power, processor power, logic power).

The plurality of second solder interconnects 216 may include a plurality of second solder interconnects 410. The plurality of second solder interconnects 410 may be arranged in various manner and configuration. The plurality of second solder interconnects 410 may be configured to provide one or more different electrical connections (e.g., power, signal, input/output, ground, misc). In some implementations, an overlay of the A-A cross section and the B-B cross section of FIGS. 21 and 22 may be described and represented by FIG. 5.

Figure 23:
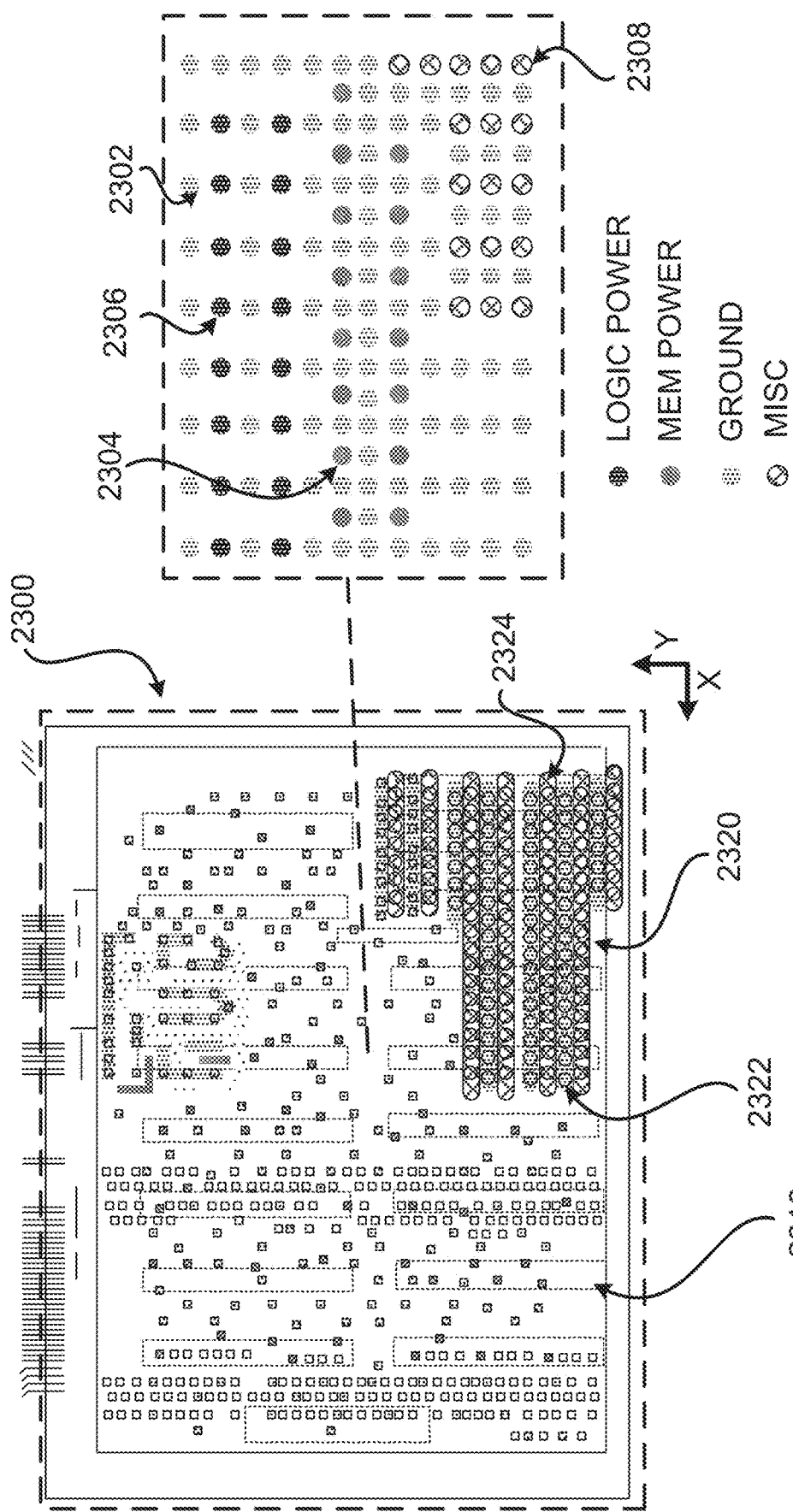
FIG. 23 illustrates a plan view of a device across an arrangement of top and bottom solder interconnects and strips.

FIG. 23 illustrates an exemplary plan view of a device 2300. The device 2300 may be implemented as the device 200 of FIG. 2. In some implementations, the device 2300 may be a more specific implementation of the device 200. The plan view of FIG. 23 may be an overlay of the A-A cross section, the B-B cross section and the M2 layer of the substrate 202 of FIG. 2.

FIG. 23 illustrates a plurality of strips 2310 aligned in along a first direction (e.g., Y-axis, Y direction). The strips 2310 may be formed on the M2 layer of the substrate 202. FIG. 23 also illustrates a section that includes a second plurality of solder interconnects 2320 (e.g., bottom solder interconnects). The second plurality of solder interconnects 2320 includes a first series of second solder interconnects 2322 and a fourth series of second solder interconnects 2324. The second plurality of solder interconnects 2320 are aligned in a second direction (e.g., along X axis, X direction).

FIG. 23 further illustrates a first series of second plurality of solder interconnects 2302, a second series of second plurality of solder interconnects 2304, a third series of second plurality of solder interconnects 2306, and a third series of second plurality of solder interconnects 2308. The series of solder interconnects may be aligned in different directions (e.g., first direction, second direction, diagonal, X direction, Y direction).

The first series of second solder interconnects 2302 may be configured to provide a first electrical connection. The second series of second solder interconnects 2304 may be configured to provide a second electrical connection. The third series of second solder interconnects 2306 may be configured to provide a third electrical connection. The fourth series of second solder interconnects 2308 may be configured to provide a fourth electrical connection. In some implementations, the first electrical connection may be ground, the second electrical connection may be power (e.g., first power, memory power), the third electrical connection may be power (e.g., second power, processor power, logic power), and the fourth electrical connection may be one or more different electrical connections (e.g., power, signal, input/output, ground, misc). It is noted that FIG. 23 does not necessarily illustrates all the interconnects (e.g., trace, via, pad, strip, solder) of the device 2300.

The disclosure describes many configurations, arrangements and alignment of the solder interconnects and/or the strips. It is noted that the various configurations described may be combined or modified with other configurations of the solder interconnects and/or strips.

Exemplary Electronic Devices

Figure 24:
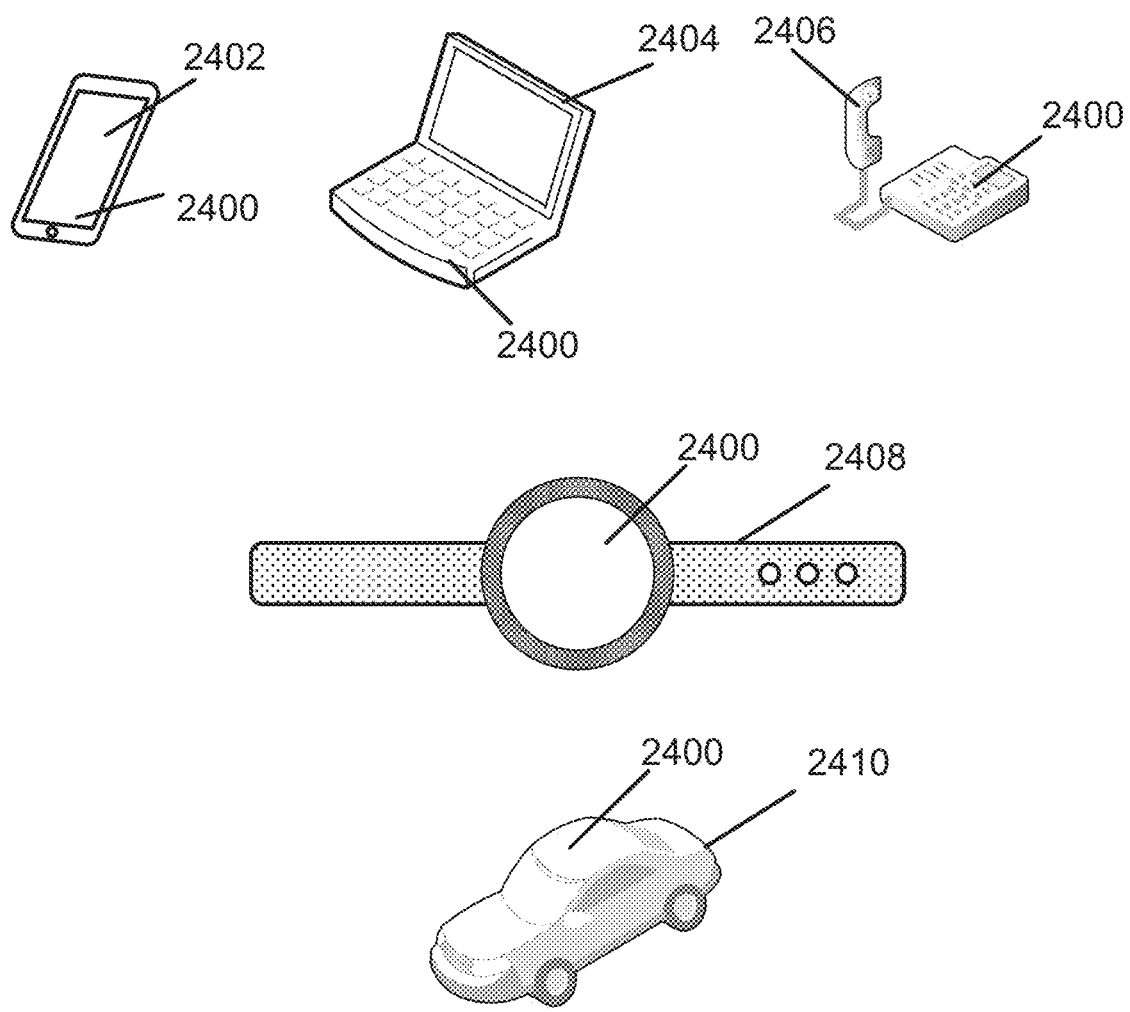
FIG. 24 illustrates various electronic devices that may integrate a die, an integrated device, an integrated passive device (IPD), a passive component, a package, and/or a device package described herein.

FIG. 24 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 2402, a laptop computer device 2404, a fixed location terminal device 2406, a wearable device 2408, or automotive vehicle 2410 may include a device 2400 as described herein. The device 2400 may be, for example, any of the devices and/or integrated circuit (IC) packages described herein. The devices 2402, 2404, 2406 and 2408 and the vehicle 2410 illustrated in FIG. 24 are merely exemplary. Other electronic devices may also feature the device 2400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-11, 12A-12B, and/or 13-24 may be rearranged and/or combined into a single component, process, feature or function or embodied in several components, processes, or functions. Additional elements, components, processes, and/or functions may also be added without departing from the disclosure. It should also be noted FIGS. FIGS. 2-11, 12A-12B, and/or 13-24 and its corresponding description in the present disclosure is not limited to dies and/or ICs. In some implementations, FIGS. 2-11, 12A-12B, and/or 13-24 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal, ground or power). An interconnect may be part of a circuit. An interconnect may include more than one interconnect, element and/or component.

The X direction, Y direction, orthogonal directions, and diagonal directions that are mentioned in the disclosure and illustrated in the figures are exemplary. However, different implementations may define the X direction, Y direction, orthogonal directions and/or diagonal directions differently. For example, the X direction and/or Y direction may be defined as a direction that is substantially parallel or perpendicular to a side surface or side wall of, a package substrate or a die.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
 a first die; and
 a package substrate including:
   a dielectric layer;
   a plurality of vias formed in the dielectric layer;
   a first plurality of interconnects formed on a first metal layer of the package substrate; and
   a second plurality of interconnects formed on a second metal layer of the package substrate;
 a plurality of first solder interconnects coupled to the first plurality interconnects, wherein the plurality of first solder interconnects includes:
   a first series of first solder interconnects arranged in a first direction, the first series of first solder interconnects configured to provide a first electrical connection; and
   a second series of first solder interconnects arranged in the first direction, the second series of first solder interconnects configured to provide a second electrical connection; and
 a plurality of second solder interconnects coupled to the second plurality interconnects, wherein the plurality of second solder interconnects includes:
   a first series of second solder interconnects arranged in a second direction, the first series of second solder interconnects configured to provide the first electrical connection; and
   a second series of second solder interconnects arranged in the second direction, the second series of second solder interconnects configured to provide the second electrical connection.

2. The device of claim 1, wherein the first direction is along an X axis, and the second direction is along a Y direction.

3. The device of claim 1, wherein the first direction is along a first diagonal direction, and the second direction is along a second diagonal direction.

4. The device of claim 1, wherein the first direction is along an X axis, and the second direction is along a diagonal direction.

5. The device of claim 1, wherein a series of solder interconnects includes two or more neighboring solder interconnects.

6. The device of claim 1, wherein the plurality of vias includes:
 a first plurality of vias configured to provide the first electrical connection, wherein each via from the first plurality of vias is located vertically between a respective first solder interconnect from the first series of first solder interconnects that vertically overlaps with a respective second solder interconnect from the first series of second solder interconnects; and
 a second plurality of vias configured to provide the second electrical connection, wherein each via from the second plurality of vias is located vertically between a respective first solder interconnect from the second series of first solder interconnects that vertically overlaps with a respective second solder interconnect from the second series of second solder interconnects.

7. The device of claim 1, wherein the first plurality of vias are arranged in a third direction.

8. The device of claim 1, further comprising a second die, wherein the plurality of first solder interconnects further includes a third series of first solder interconnects arranged in the first direction, the third series of first solder interconnects configured to provide a third electrical connection, and
 wherein the plurality of second solder interconnects further includes a third series of second solder interconnects arranged in the second direction, the third series of second solder interconnects configured to provide the third electrical connection.

9. The device of claim 8, wherein the first electrical connection comprises a first power for the first die, the second electrical connection comprises a second power for the second die, and the third electrical connection is ground.

10. The device of claim 1, wherein the first series of first solder interconnects includes offset solder interconnects.

11. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

12. The device of claim 1, wherein the first electrical connection comprises a first power for the first die, and the second electrical connection is ground.

* * * * *